US012641961B2

(12) United States Patent
Park et al.

(10) Patent No.: US 12,641,961 B2
(45) Date of Patent: May 26, 2026

(54) DISPLAY DEVICE AND METHOD OF FABRICATING THE SAME

(71) Applicant: Samsung Display Co., LTD., Yongin-si (KR)

(72) Inventors: Chul Won Park, Yongin-si (KR); Myoung Hwa Kim, Yongin-si (KR); Geun Chul Park, Yongin-si (KR); Jun Hyung Lim, Yongin-si (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 18/356,445

(22) Filed: Jul. 21, 2023

(65) Prior Publication Data

US 2024/0188335 A1     Jun. 6, 2024

(30) Foreign Application Priority Data

Dec. 1, 2022     (KR) ........................ 10-2022-0165707

(51) Int. Cl.
| | |
|---|---|
| H10K 59/122 | (2023.01) |
| H10K 59/12 | (2023.01) |
| H10K 71/20 | (2023.01) |
| *H10K 102/00* | (2023.01) |

(52) U.S. Cl.
CPC ....... H10K 59/122 (2023.02); H10K 59/1201 (2023.02); H10K 71/231 (2023.02); *H10K 2102/351* (2023.02)

(58) Field of Classification Search
CPC ............. H10K 59/122; H10K 59/1201; H10K 71/231; H10K 2102/351; H10K 59/00; H10K 59/124; H10K 71/00; H10K 59/12; H10K 59/123; H10K 50/11; H10K 50/15; H10K 50/16; H10K 50/17; H10K 50/81; H10K 50/82
See application file for complete search history.

(56) References Cited

U.S. PATENT DOCUMENTS

| | | | | |
|---|---|---|---|---|
| 2006/0267885 | A1* | 11/2006 | Kwak | ................... G09G 3/3233 345/76 |
| 2019/0164999 | A1 | 5/2019 | Choi | |

FOREIGN PATENT DOCUMENTS

| | | |
|---|---|---|
| KR | 10-2020-0014053 | 2/2020 |
| KR | 10-2248402 | 5/2021 |

* cited by examiner

*Primary Examiner* — Kevin Quarterman
(74) *Attorney, Agent, or Firm* — Innovation Counsel LLP

(57) ABSTRACT

A display device and a manufacturing method of the display device are provided. The display device includes a substrate, a passivation layer disposed on the substrate, a metal oxide layer disposed on the passivation layer, a via layer disposed on the metal oxide layer, a first electrode disposed on the via layer, a pixel defining layer covering the metal oxide layer and an edge portion of the first electrode and dividing a light-emitting area, an organic layer disposed on the first electrode and the pixel defining layer, and a second electrode disposed on the organic layer, wherein a side of the pixel defining layer protrudes more outward than a side of the metal oxide layer, and at least a portion of the organic layer is disconnected at a point between the side of the pixel defining layer and the passivation layer.

14 Claims, 23 Drawing Sheets

ED : 210, EL, 240
UNC : UNC1, UNC2

DISPLAY DEVICE AND METHOD OF FABRICATING THE SAME

CROSS-REFERENCE TO RELATED APPLICATION(S)

This application claims priority to and benefits of Korean Patent Application No. 10-2022-0165707 under 35 U.S.C. § 119, filed on Dec. 1, 2022, in the Korean Intellectual Property Office, the entire contents of which are incorporated herein by reference.

BACKGROUND

1. Technical Field

Embodiments relate to a display device and a method of fabricating the display device.

2. Description of the Related Art

As the information-oriented society evolves, various demands for display devices have increased. For example, display devices are applied to a variety of electronic devices such as smart phones, digital cameras, laptop computers, navigation devices, and smart televisions.

Display devices include flat panel display devices such as a liquid-crystal display device, a field emission display device, and a light-emitting display device. Light-emitting display devices include an organic light-emitting display device with organic light-emitting elements, an inorganic light-emitting display device with inorganic light-emitting elements such as inorganic semiconductor, and a micro light-emitting display device with micro light-emitting elements.

An organic light-emitting element includes two opposing electrodes and an emission layer interposed between the two opposing electrodes. Electrons and holes supplied from the two opposing electrodes are recombined in the emissive layer to generate excitons, and the generated excitons relax from the excited state to the ground state to emit light.

Organic light-emitting display devices with an organic light-emitting element require no separate light source such as a backlight unit, and thus it consumes less power. Further, the organic light-emitting display device are light and have high-quality characteristics such as wide viewing angle, high luminance and contrast, and fast response speed. Accordingly, the organic light-emitting display devices are attracting attention as the next generation display device.

SUMMARY

Embodiments provide a display device capable of improving color mixing by reducing the off current (or leakage current) and a method of manufacturing the display device.

However, embodiments of the disclosure are not limited to those set forth herein. The above and other embodiments will become more apparent to one of ordinary skill in the art to which the disclosure pertains by referencing the detailed description of the disclosure given below.

According to an aspect of the disclosure, a display device may include a substrate, a passivation layer disposed on the substrate, a metal oxide layer disposed on the passivation layer, a via layer disposed on the metal oxide layer, a first electrode disposed on the via layer, a pixel defining layer covering the metal oxide layer and an edge portion of the first electrode and dividing a light-emitting area, an organic layer disposed on the first electrode and the pixel defining layer, and a second electrode disposed on the organic layer, wherein a side of the pixel defining layer protrudes more outward than a side of the metal oxide layer, and at least a portion of the organic layer is disconnected at a point between the side of the pixel defining layer and the passivation layer.

In an embodiment, the metal oxide layer and the pixel defining layer may form an undercut portion.

In an embodiment, an undercut portion may surround the light-emitting area.

In an embodiment, a thickness of the metal oxide layer and a distance between a lower surface of the pixel defining layer and an upper surface of the passivation layer may be same as each other, and the thickness of the metal oxide layer may be smaller than the thickness of the organic layer.

In an embodiment, the organic layer may include a hole injection layer, a hole transport layer, a light-emitting layer, an electron transport layer and an electron injection layer.

In an embodiment, the hole injection layer may be disconnected by an undercut portion disposed between the side of the pixel defining layer and the passivation layer.

In an embodiment, a thickness of the metal oxide layer may be greater than a thickness of the hole injection layer.

In an embodiment, the metal oxide layer may overlap the via layer, the first electrode and the pixel defining layer, and the metal oxide layer may have an island shape.

In an embodiment, a size of the via layer may be smaller than a size of the metal oxide layer and the via layer and the first electrode may have an island shape in plan view.

In an embodiment, the organic layer may include at least a hole injection layer and a charge generating layer, and the hole injection layer and the charge generating layer, or only the hole injection layer may be disconnected by an undercut portion disposed between the side of the pixel defining layer and the passivation layer.

According to an aspect of the disclosure, a display device may include a substrate, a passivation layer disposed on the substrate, a first metal oxide layer disposed on the passivation layer, a via layer disposed on the first metal oxide layer, a first electrode disposed on the via layer, a second metal oxide layer disposed on an edge portion of the first electrode, a pixel defining layer covering the second metal oxide layer and dividing a light-emitting area, an organic layer disposed on the first electrode and the pixel defining layer, and a second electrode disposed on the organic layer, wherein an outer side of the pixel defining layer may protrude more outward than a side of the first metal oxide layer and an inner side of the pixel defining layer may protrude more outward than a side of the second metal oxide layer, and at least a portion of the organic layer may be disconnected at a point between the outer side of the pixel defining layer and the passivation layer and at a point between the inner side of the pixel defining layer and the first electrode.

In an embodiment, the organic layer may include a hole injection layer, a hole transport layer, a light-emitting layer, an electron transport layer and an electron injection layer, and the hole injection layer is disconnected by a first undercut portion disposed between the outer side of the pixel defining layer and the passivation layer and by a second undercut portion disposed between the inner side of the pixel defining layer and the first electrode.

In an embodiment, the organic layer may include at least a hole injection layer and a charge generating layer, and the hole injection layer and the charge generating layer, or only the hole injection layer may be disconnected by a first undercut portion disposed between the outer side of the pixel defining layer and the passivation layer and by a second undercut portion disposed between the inner side of the pixel defining layer and the first electrode.

In an embodiment, a side of the first electrode and the outer side of the second metal oxide layer may be aligned and coincide with each other, and the side of the first electrode and a side of the via layer may be aligned and coincide with each other.

According to an aspect of the disclosure, a method of fabricating a display device may include forming a passivation layer on a substrate, forming a first protective material layer on the passivation layer, forming a via layer on the first protective material layer, forming a first electrode on the via layer, forming a pixel defining layer covering an edge portion of the first electrode, forming a first metal oxide layer by using the pixel defining layer as a mask to etch the first protective material layer such that an outer side of the pixel defining layer protrudes more outward than a side of the first metal oxide layer, forming an organic layer on the first electrode and the pixel defining layer such that at least a portion of the organ layer is disconnected at a point between the outer side of the pixel defining layer and the passivation layer, and forming a second electrode on the organic layer.

In an embodiment, the first protective material layer may be overetched by a wet-etching method.

In an embodiment, the organic layer may include a hole injection layer, a hole transport layer, a light-emitting layer, an electron transport layer and an electron injection layer, and the hole injection layer may be disconnected at the point between the outer side of the pixel defining layer and the passivation layer.

In an embodiment, the method further may include forming a second protective material layer on the first electrode before the forming of the pixel defining layer.

In an embodiment, the method may include forming a second metal oxide layer by etching the second protective material layer, wherein the forming of the second metal oxide layer and the forming of the first metal oxide layer may be performed simultaneously, and the inner side of the pixel defining layer may protrude more outward than the inner side of the second metal oxide layer.

In an embodiment, the organic layer may include a hole injection layer, a hole transport layer, a light-emitting layer, an electron transport layer and an electron injection layer, and the hole injection layer is disconnected by a first undercut portion disposed between the outer side of the pixel defining layer and the passivation layer and by a second undercut portion disposed between the inner side of the pixel defining layer and the first electrode.

According to an embodiment of the disclosure, a hole injection layer or the hole injection layer and a charge generation layer acting as a charge transfer path may be disconnected by forming an undercut portion in respect to a pixel defining layer by using at least one protective layer. Accordingly, the off current of the display device may be blocked to prevent color mixing and display quality may be improved.

The effects of the disclosure are not limited to the aforementioned effects, and various other effects are included in the description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
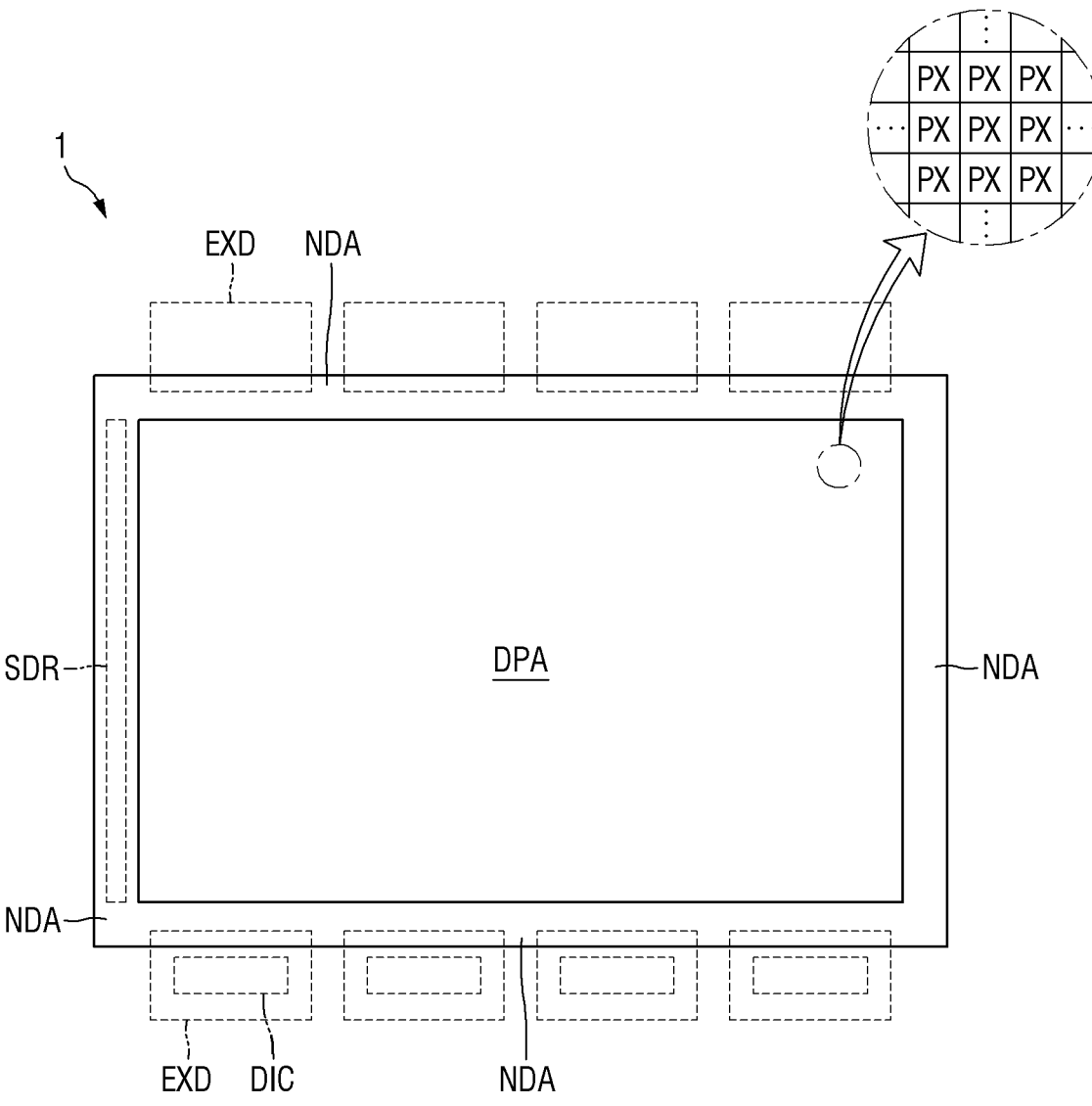
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic plan view of a display device according to an embodiment.

Referring to FIG. 1, a display device 1 according to an embodiment may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device. For example, a television (TV) is described as an example of a display device, and the TV may have a high resolution or an ultra high resolution such as HD, UHD, 4K and 8K.

For example, the display device 1 according to an embodiment may be classified into various types according to a display method. Examples of the display device may include an organic light emitting display (OLED) device, an inorganic light emitting display (inorganic EL) device, a quantum dot light emitting display (QED) device, a micro-LED display device, a nano-LED display device, a plasma display device (PDP), a field emission display (FED) device and a cathode ray tube (CRT) display device, a liquid crystal display (LCD) device, an electrophoretic display (EPD) device, and the like. Hereinafter, the organic light emitting display device will be described as an example of the display device, and the organic light emitting display device applied to the embodiment will be simply referred to as a display device. However, embodiments are not limited thereto, and other display devices mentioned above may be applied to the embodiments.

The display device 1 according to an embodiment may have a square shape, e.g., a rectangular shape in plan view. In a case where the display device 1 is a television, the display device 1 may be disposed such that its long side extends in a horizontal direction. However, embodiments are not limited thereto, and the long side of the display device 1 may extend in a vertical direction. In another example, the display device 1 may be installed to be rotatable such that its long side is variably positioned to extend in the horizontal or vertical direction.

The display device 1 may include a display area DPA and a non-display area NDA. The display area DPA may be an active area in which an image is displayed. The display area DPA may have a rectangular shape in plan view similar to the overall shape of the display device 1, but embodiments are not limited thereto.

The display area DPA may include pixels PX. The pixels PX may be arranged in a matrix. The shape of each pixel PX may be rectangular or square in plan view. In another example, each pixel PX may have a rhombic shape of which each side is inclined with respect to a side direction of the display device 1. The pixels PX may include multiple color pixels PX. For example, the pixels PX may include a first color pixel PX of red, a second color pixel PX of green, and a third color pixel PX of blue, but embodiments are not limited thereto. The color pixels PX may be alternately arranged in a stripe type or a PenTile™ M type.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 1.

In the non-display area NDA, a driving circuit or a driving element for driving the display area DPA may be disposed. In an embodiment, in a first non-display area NDA disposed adjacent to a first long side (e.g., lower side in FIG. 1) of the display device 1 and a second non-display area NDA disposed adjacent to a second long side (e.g., upper side in FIG. 1) of the display device 1, pad portions may be provided (or disposed) on a display substrate of the display device 1, and external devices EXD may be mounted on pad electrodes of the pad portions. The external devices EXD may include, e.g., a connection film, a printed circuit board, a driver integrated circuit (DIC), a connector, a wiring connection film and the like. A scan driver SDR formed (e.g., directly formed) on the display substrate of the display device 1 may be provided (or disposed) in a third non-display area NDA disposed adjacent to a first short side (e.g., left side in FIG. 1) of the display device 1.

Figure 2:
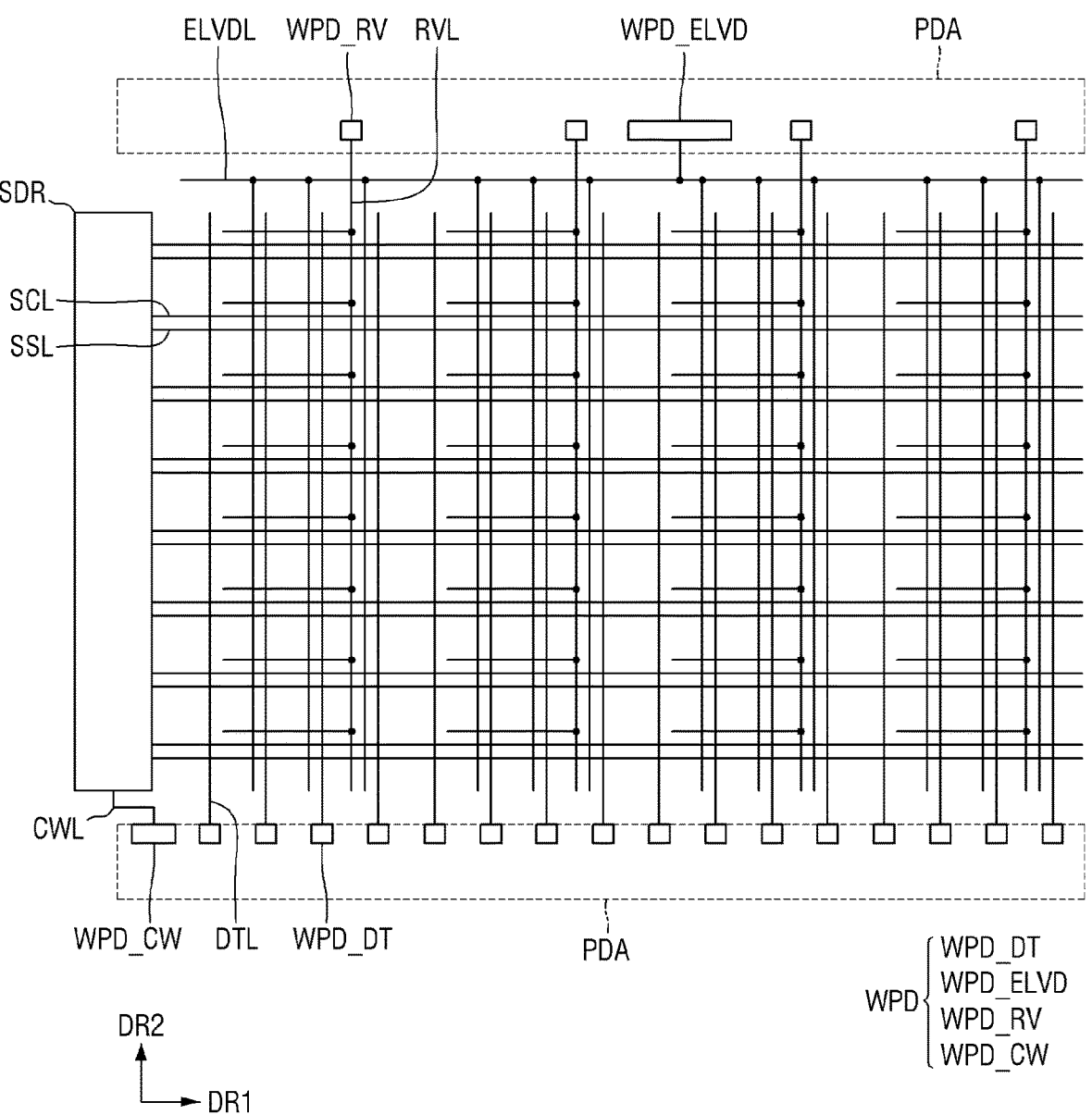
FIG. 2 is a schematic layout view illustrating a circuit of a first substrate of the display device according to an embodiment.

FIG. 2 is a schematic layout view illustrating a circuit of a first substrate of the display device according to an embodiment.

Referring to FIG. 2, wirings may be disposed on the first substrate. The wirings may include a scan line SCL, a sensing signal line SSL, a data line DTL, a reference voltage line RVL, a first power line ELVDL, and the like.

The scan line SCL and the sensing signal line SSL may extend in a first direction DR1. The scan line SCL and the sensing signal line SSL may be connected to the scan driver SDR. The scan driver SDR may include a driving circuit formed of a circuit layer. The scan driver SDR may be disposed in the third non-display area NDA on the first substrate, but embodiments are not limited thereto. The scan driver SDR may be disposed in a fourth non-display area NDA or may be disposed in both the third and fourth non-display areas NDA. The scan driver SDR may be connected to a signal connection wiring CWL, and at least one end portion of the signal connection wiring CWL may form a pad WPD_CW on the first non-display area NDA and/or the second non-display area NDA which may be connected to the external devices ('EXD' in FIG. 1).

The data line DTL and the reference voltage line RVL may extend in a second direction DR2 crossing the first direction DR1. The first power line ELVDL may include portions extending in the second direction DR2. The first power line ELVDL may further include a portion extending in the first direction DR1. The first power line ELVDL may have a mesh structure, but embodiments are not limited thereto.

At least one end portion of the data line DTL, the reference voltage line RVL, and the first power line ELVDL may be provided with wiring pads WPD. Each wiring pad WPD may be provided (or disposed) in a pad portion PDA of the non-display area NDA. In an embodiment, a wiring pad WPD_DT (hereinafter, referred to as "data pad") of the data line DTL may be disposed in the pad portion PDA of the first non-display area NDA. A wiring pad WPD_RV (hereinafter referred to as "reference voltage pad") of the reference voltage line RVL and a wiring pad WPD_ELVD (hereinafter referred to as "first power pad") of the first power line ELVDL may be disposed in the second non-display area NDA. As another example, the data pad WPD_DT, the reference voltage pad WPD_RV, and the first power pad WPD_ELVD may all be disposed in the same area, e.g., the first non-display area NDA. As described above, the external devices ('EXD' in FIG. 1) may be mounted on the wiring pads WPD. The external devices EXD may be mounted on the wiring pads WPD by applying an anisotropic conductive film, ultrasonic bonding or the like.

Each pixel PX on the first substrate includes a pixel driving circuit. The above-described wirings may pass through each pixel PX or the periphery thereof to apply a driving signal to each pixel driving circuit. The pixel driving circuit may include transistors and capacitors. The number of transistors and capacitors of each pixel driving circuit may be variously modified. Hereinafter, the pixel driving circuit will be described in conjunction with a 3T-1C structure including three transistors and one capacitor as an example. However, embodiments are not limited thereto, and other modified pixel PX structures such as a 2T-1C structure, a 7T-1C structure, and a 6T-1C structure may be adopted.

Figure 3:
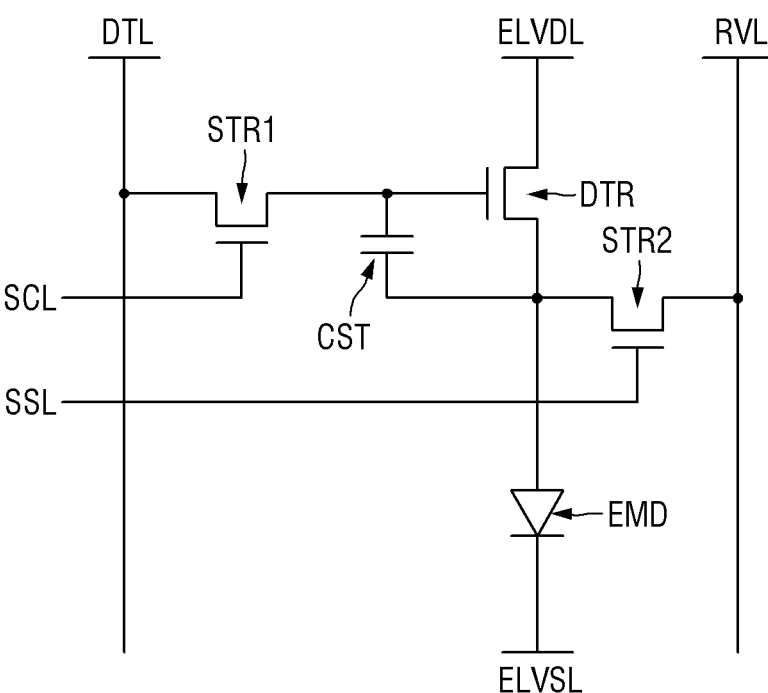
FIG. 3 is a schematic diagram of an equivalent circuit of a pixel of a display device according to an embodiment.

FIG. 3 is a schematic diagram of an equivalent circuit of a pixel of a display device according to an embodiment.

Referring to FIG. 3, each pixel PX of the display device according to an embodiment may include three transistors DTR, STR1, and STR2 and one storage capacitor CST in addition to a light emitting element EMD.

The light emitting element EMD may emit light according to a current supplied through a driving transistor DTR. The light emitting element EMD may be implemented as an organic light emitting diode, a micro light emitting diode, a nano light emitting diode, or the like.

A first electrode (e.g., anode electrode) of the light emitting element EMD may be connected to a source electrode of the driving transistor DTR, and a second electrode (e.g., cathode electrode) of the light emitting element EMD may be connected to a second power line ELVSL to which a low potential voltage (e.g., second source voltage) lower than a high potential voltage (e.g., first source voltage) of the first power line ELVDL is supplied.

The driving transistor DTR may adjust a current flowing from the first power line ELVDL, to which the first source voltage is applied, to the light emitting element EMD according to a voltage difference between a gate electrode and the source electrode. The gate electrode of the driving transistor DTR may be connected to a first source/drain electrode of the first switching transistor STR1, the source electrode of the driving transistor DTR may be connected to the first electrode of the light emitting element EMD, and a drain electrode of the driving transistor DTR may be connected to the first power line ELVDL to which the first source voltage is applied.

The first switching transistor STR1 may be turned on by a scan signal applied from the scan line SCL to connect the data line DTL to the gate electrode of the driving transistor DTR. A gate electrode of the first switching transistor STR1 may be connected to the scan line SCL, the first source/drain electrode of the first switching transistor STR1 may be connected to the gate electrode of the driving transistor DTR, and a second source/drain electrode of the first switching transistor STR1 may be connected to the data line DTL.

The second switching transistor STR2 may be turned on by a sensing signal applied from the sensing signal line SSL to connect the reference voltage line RVL to the source electrode of the driving transistor DTR. A gate electrode of the second switching transistor STR2 may be connected to the sensing signal line SSL, the first source/drain electrode of the second switching transistor STR2 may be connected to the reference voltage line RVL, and the second source/drain electrode of the second switching transistor STR2 may be connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode. However, embodiments are not limited thereto, and the opposite case may be applied.

The storage capacitor CST may be formed between the gate electrode and the source electrode of the driving transistor DTR. The storage capacitor CST may store a difference voltage between a gate voltage and a source voltage of the driving transistor DTR.

The driving transistor DTR, the first switching transistor STR1, and the second switching transistor STR2 may be formed as thin film transistors. Further, in the description of FIG. 3, it is assumed that the driving transistor DTR, the first switching transistor STR1, and the second switching transistor STR2 are N-type metal oxide semiconductor field effect transistors (MOSFETs), but embodiments are not limited thereto. For example, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs in case that others are P-type MOSFETs.

Figure 4:
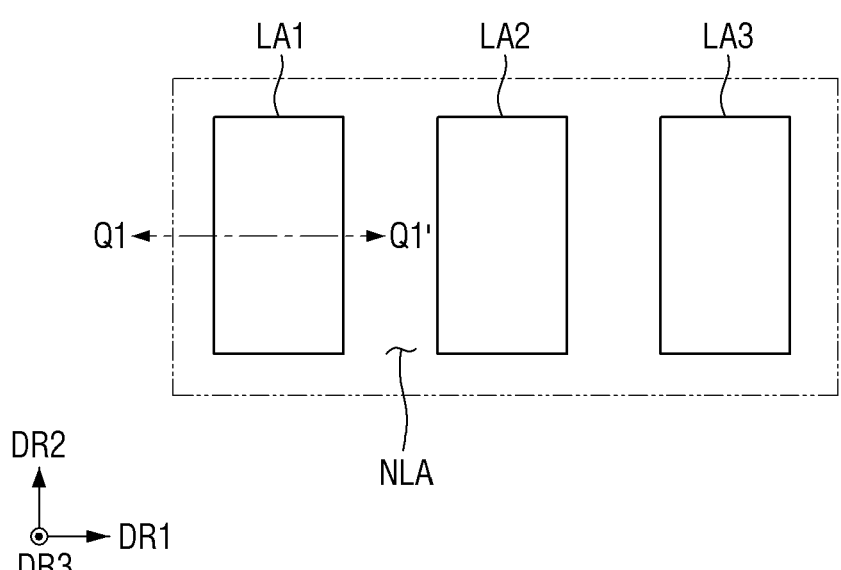
FIG. 4 is a schematic plan view illustrating a pixel of an organic light-emitting display device according to an embodiment.

FIG. 4 is a schematic plan view illustrating a pixel of an organic light-emitting display device according to an embodiment.

Referring to FIG. 4, light-emitting areas LA1, LA2, and LA3 and a non-emission area NLA may be defined on the substrate in the display area DPA. In some embodiments, the light-emitting areas LA1, LA2, and LA3 of the display area DPA may include a first light-emitting area LA1, a second light-emitting area LA2, and a third light-emitting area LA3. The first light-emitting area LA1, the second light-emitting area LA2, and the third light-emitting area LA3 may be areas through which light generated by the light-emitting element of the substrate is emitted to the outside, and the non-emission area NLA may be an area in which light is not emitted to the outside.

In some embodiments, the same lights may exit (or emit) out of the first light-emitting area LA1, the second light-emitting area LA2 and the third light-emitting area LA3. For example, the first light-emitting area LA1, the second light-emitting area LA2, and the third light-emitting area LA3 may emit light of blue color. In another example, different lights may exit (or emit) out of the first light-emitting area LA1, the second light-emitting area LA2 and the third light-emitting area LA3. For example, the first light-emitting area LA1 may emit light of a first color, the second light-emitting area LA2 may emit light of a second color, and the third light-emitting area LA3 may emit light of a third color. The light of the first color may be blue light having a peak wavelength in the range of about 440 to about 480 nm. The light of the second color may be red light having a peak wavelength in the range of about 610 to about 650 nm. The light of the third color may be green light having a peak wavelength in the range of about 510 to about 550 nm. It should be understood, however, that embodiments are not limited thereto. The light of the second color may be green light and the light of the third color may be red light.

In some embodiments, the first light-emitting area LA1, the second light-emitting area LA2, and the third light-emitting area LA3 may form one group, and groups may be defined in the display area DPA.

As shown in FIG. 4, in some embodiments, the first light-emitting area LA1, the second light-emitting area LA2, and the third light-emitting area LA3 may be sequentially positioned along a direction. In some embodiments, in the display area DPA, the first light-emitting area LA1, the second light-emitting area LA2, and the third light-emitting area LA3 may form one group to be repeatedly arranged.

However, embodiments are not limited thereto, and the arrangement of the first light-emitting area LA1, the second light-emitting area LA2, and the third light-emitting area LA3 may be variously changed.

Figure 5:
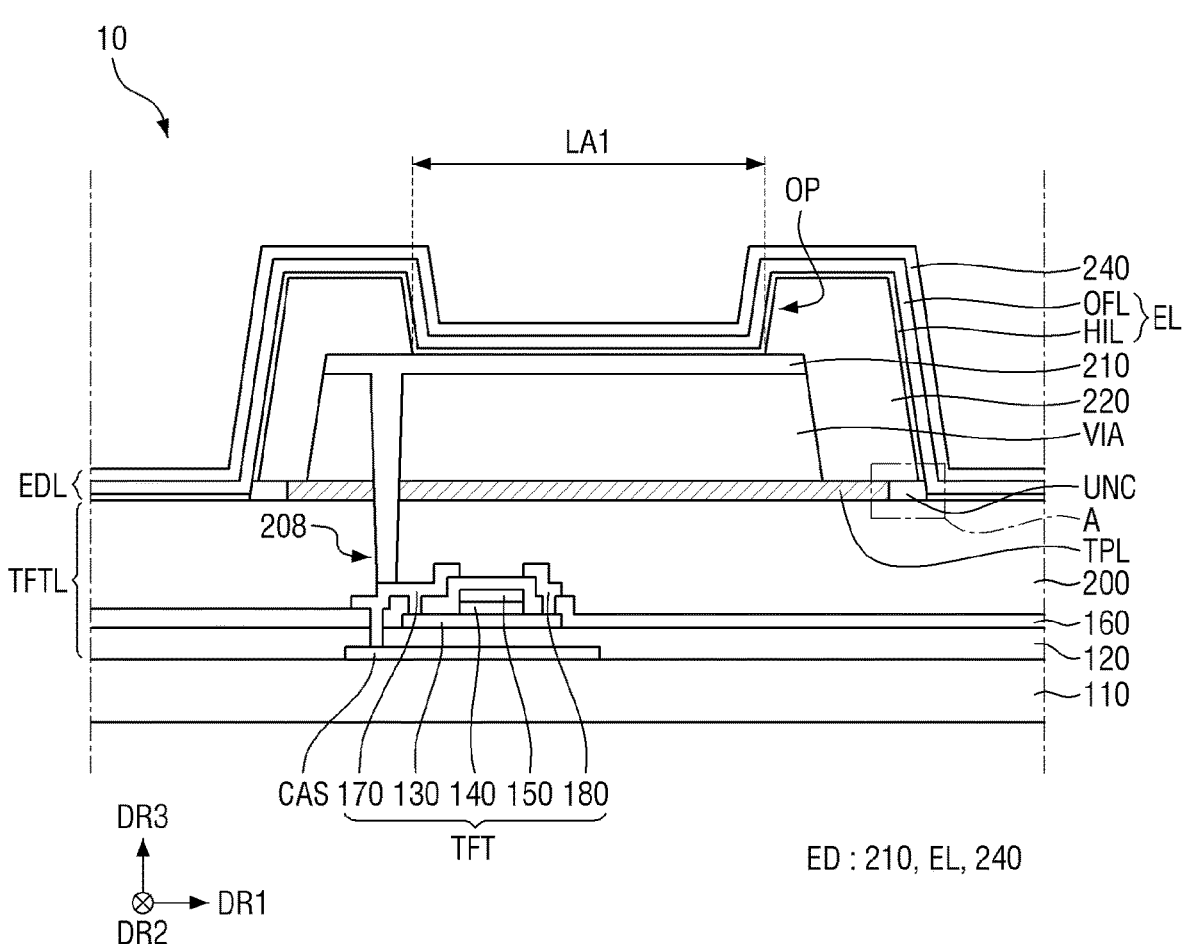
FIG. 5 is a schematic cross-sectional view taken along line Q1-Q1' of FIG. 4.
Figure 6:
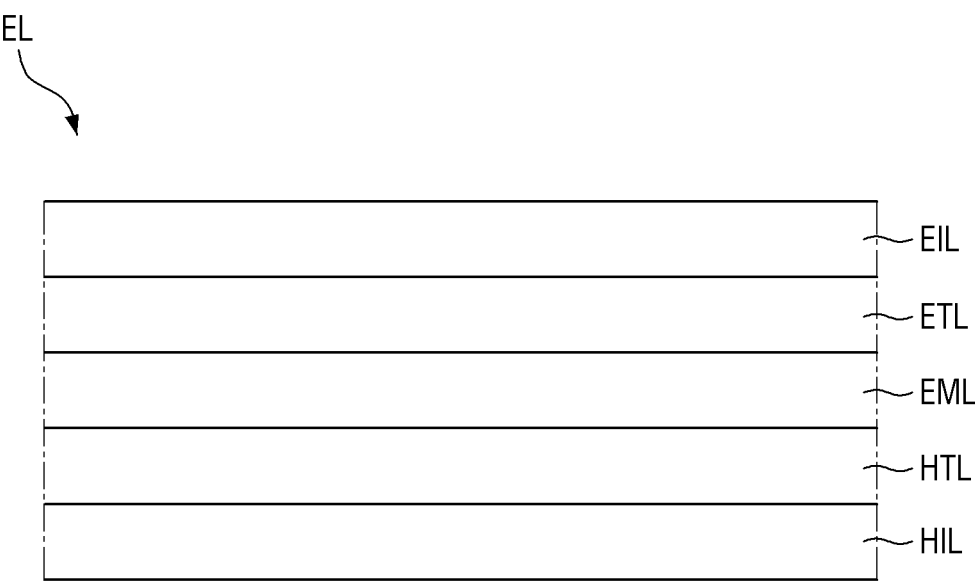
FIG. 6 is a schematic diagram showing an example of an organic layer of a display device according to an embodiment.
Figure 7:
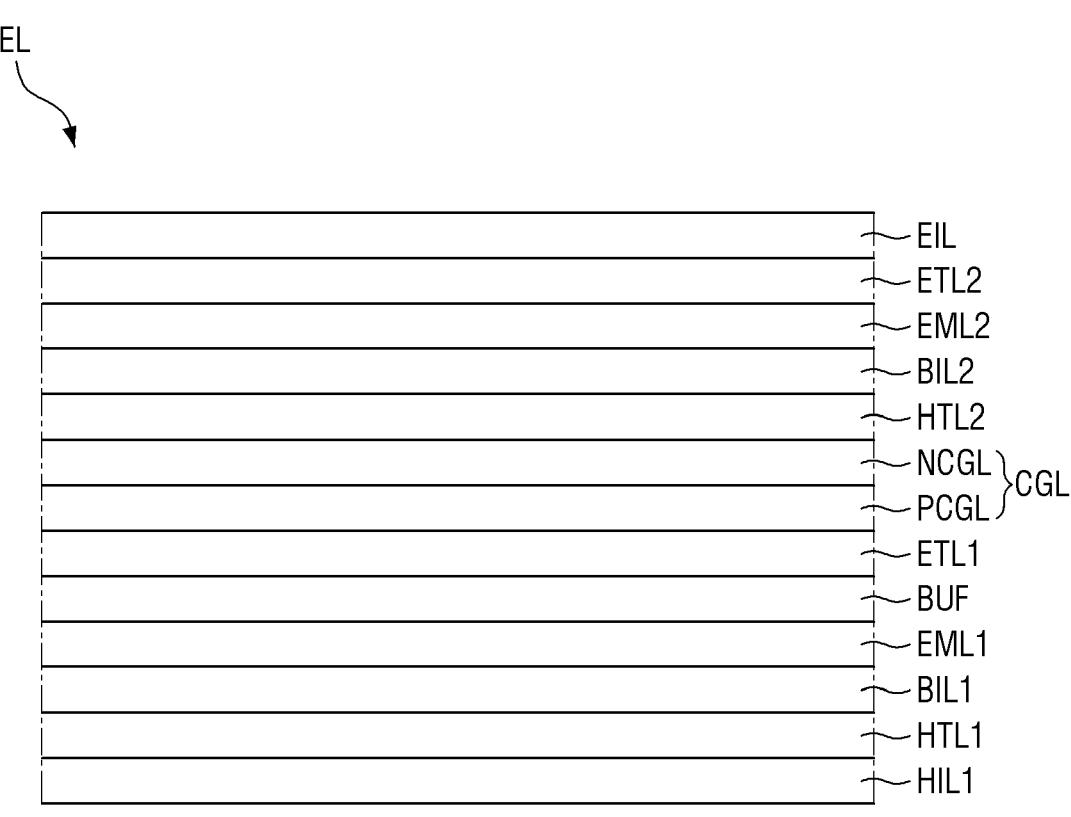
FIG. 7 is a schematic diagram showing another example of an organic layer of a display device according to an embodiment.
Figure 8:
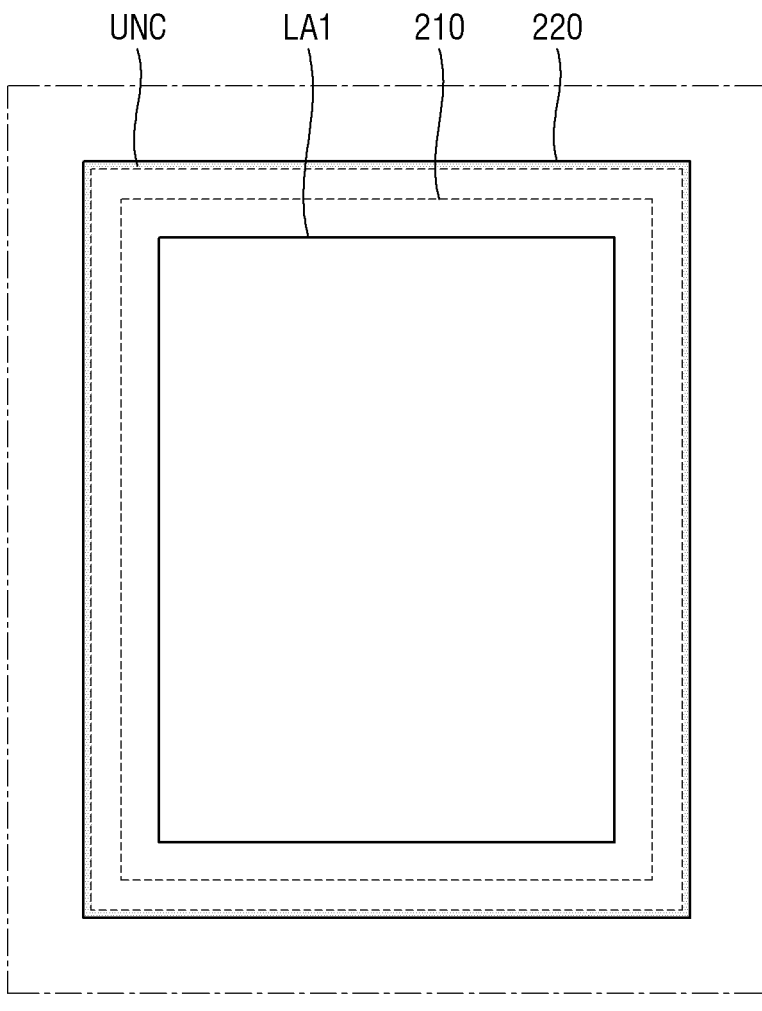
FIG. 8 is a schematic plan view showing a first light-emitting area of a display device according to an embodiment.
Figure 9:
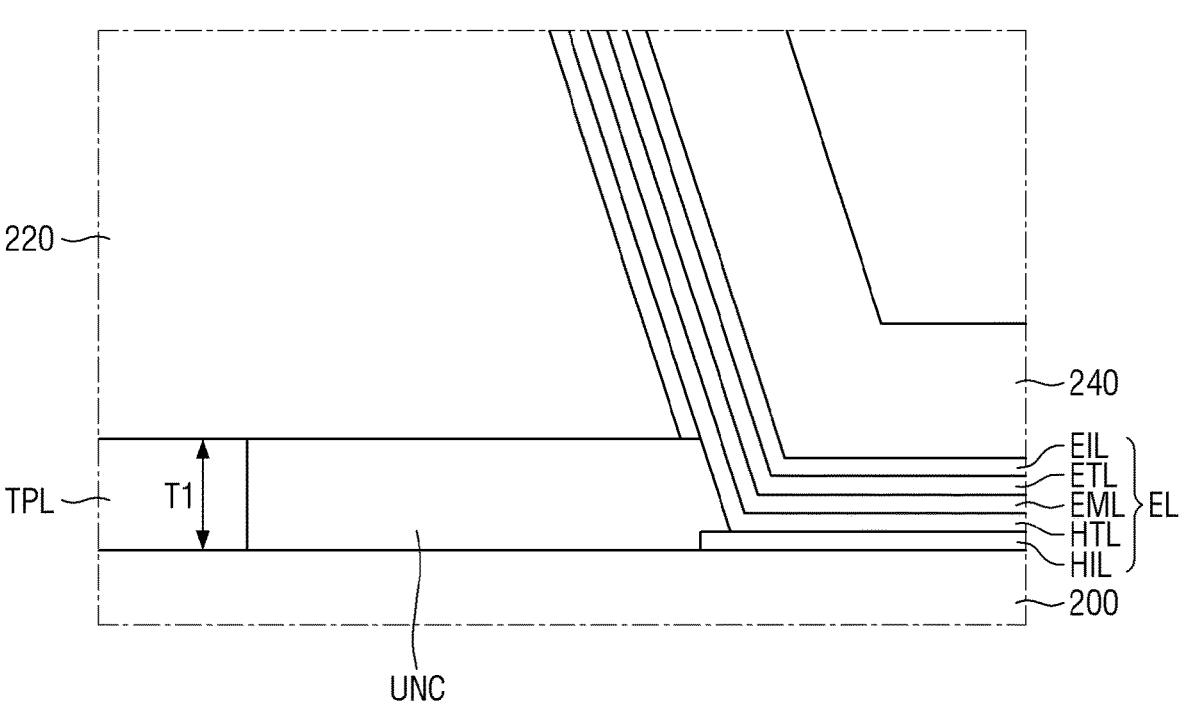
FIG. 9 is an enlarged schematic diagram of an example of an area A of FIG. 5.
Figure 10:
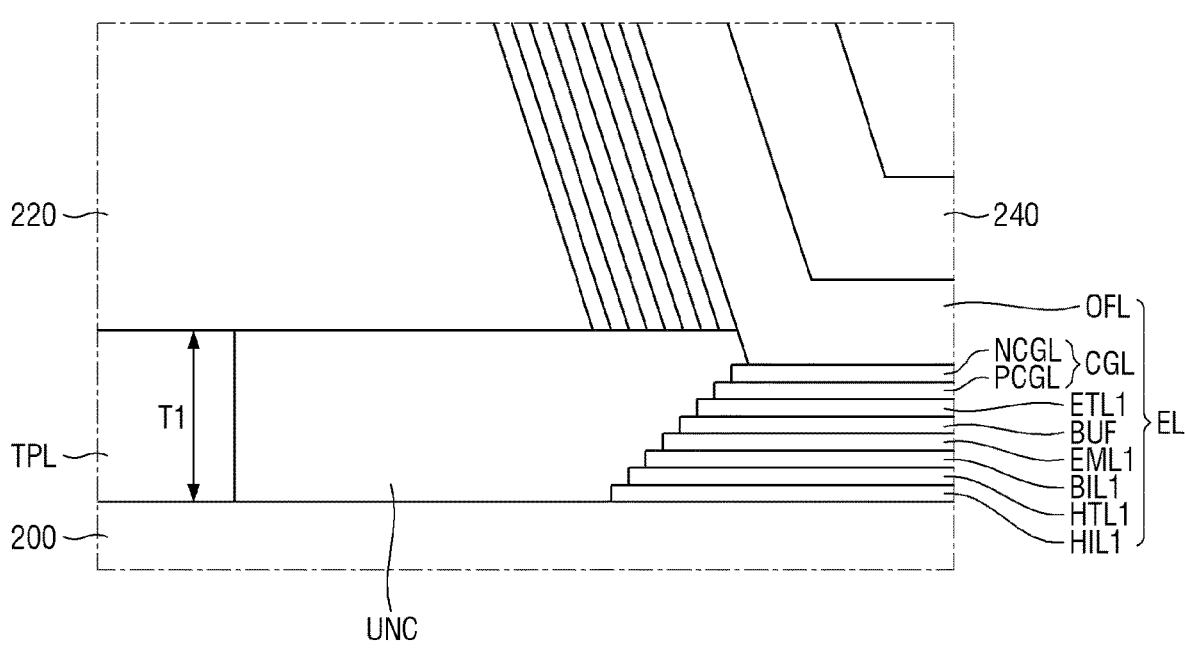
FIG. 10 is an enlarged schematic diagram of another example of the area A of FIG. 5.

FIG. 5 is a schematic cross-sectional view taken along line Q1-Q1' of FIG. 4. FIG. 6 is a schematic diagram showing an example of an organic layer of a display device according to an embodiment. FIG. 7 is a schematic diagram showing another example of an organic layer of a display device according to an embodiment. FIG. 8 is a schematic plan view showing a first light-emitting area of a display device according to an embodiment. FIG. 9 is an enlarged schematic diagram of an example of an area A of FIG. 5. FIG. 10 is an enlarged schematic diagram of another example of the area A of FIG. 5.

Referring to FIGS. 5 to 10, a display device 10 according to an embodiment may include a substrate 110, a thin film transistor layer TFTL and the light-emitting element layer EDL disposed on the substrate 110.

The substrate 110 may be a rigid substrate or a flexible substrate which is bendable, foldable, or rollable. The substrate 110 may be made of an insulating material such as glass, quartz, or polymer resin. Examples of a polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof. The substrate 110 may include a metal material.

The thin film transistor layer TFTL may be disposed on the substrate 110. The thin film transistor layer TFTL may include a thin film transistor TFT, a lower metal layer CAS, a buffer layer 120, a gate insulating layer 140, an interlayer insulating layer 160, and a passivation layer 200.

A lower metal layer CAS may be disposed on the substrate 110. The lower metal layer CAS may overlap an active layer 130 of the thin film transistor TFT of the display device 10. The lower metal layer CAS may include a material that blocks light, and may prevent light from being incident on the active layer 130 of the thin film transistor TFT. For example, the lower metal layer CAS may be formed of an opaque metal material that blocks transmission of light. However, embodiments are not limited thereto, and the lower metal layer CAS may be omitted in some cases.

The buffer layer 120 may be disposed (e.g., entirely disposed) on the lower metal layer CAS and the substrate 110. The buffer layer 120 may be disposed on the substrate 110 to protect the thin film transistor TFT and a light emitting element ED from moisture penetrating through the substrate 110 susceptible to moisture permeation. The buffer layer 120 may include alternately stacked inorganic layers. For example, the buffer layer 120 may be formed of a multilayer in which one or more inorganic layers of silicon oxide ($SiO_x$), silicon nitride ($SiN_x$), and silicon oxynitride ($SiO_xN_y$) are alternately stacked. However, embodiments are not limited thereto, and the buffer layer 120 may be omitted.

The thin film transistor TFT may be disposed on the buffer layer 120. The thin film transistor TFT may include an active layer 130, a gate electrode 150, a source electrode 170, and a drain electrode 180. Although FIG. 5 illustrates that the thin film transistor TFT is formed by a top gate method in which the gate electrode 150 is located above the active layer 130, embodiments are not limited thereto. For example, the thin film transistor TFT may be formed by a bottom gate method in which the gate electrode 150 is located below the active layer 130, or a double gate method in which the gate electrode 150 is located both above and below the active layer 130.

The active layer 130 may be disposed on the buffer layer 120. The active layer 130 may include polycrystalline silicon, monocrystalline silicon, an oxide semiconductor, or the like. In case that the semiconductor layer includes an oxide semiconductor, the active layer 130 may include conductive regions and a channel region therebetween. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO) or the like.

In another example, the active layer 130 may include polycrystalline silicon. The polycrystalline silicon may be formed by crystallizing amorphous silicon. For example, the conductive regions of the active layer 130 may be regions doped with impurities.

The gate insulating layer 140 may be formed on the active layer 130. The gate insulating layer 140 may be disposed on the active layer 130. The gate insulating layer 140 and a gate electrode 150 may be patterned in the same size and the same shape. The gate insulating layer 140 may be formed of an inorganic layer including an inorganic material, such as silicon oxide ($SiO_x$), silicon nitride ($SiN_x$) or silicon oxynitride ($SiO_xN_y$), or a stacked structure thereof.

The gate electrode 150 may be disposed on the gate insulating layer 140. A gate line, an electrode of the storage capacitor, and the gate electrode 150 may be further disposed on the same layer. The gate electrode 150 may overlap the active layer 130 in the thickness direction. The gate electrode 150 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments are not limited thereto.

The interlayer insulating layer 160 may be disposed on the gate electrode 150. The interlayer insulating layer 160 may function as an insulating layer between the gate electrode 150 and other layers disposed thereon. For example, the interlayer insulating layer 160 may cover the gate electrode 150 and function to protect the gate electrode 150. The interlayer insulating layer 160 may be formed of an inorganic layer including an inorganic material, such as silicon oxide ($SiO_x$), silicon nitride ($SiN_x$) or silicon oxynitride ($SiO_xN_y$), or a stacked structure thereof.

The source electrode 170 and the drain electrode 180 may be disposed on the interlayer insulating layer 160. Each of the source electrode 170 and the drain electrode 180 may be connected (e.g., electrically connected) to the active layer 130 via contact holes passing through the interlayer insulating layer 160. The source electrode 170 may be connected (e.g., electrically connected) to the lower metal layer CAS through another contact hole.

The source electrode 170 and the drain electrode 180 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments are not limited thereto. Accordingly, the thin film transistor TFT including the active layer 130, the gate electrode 150, the source electrode 170, and the drain electrode 180 may be disposed.

The passivation layer 200 may be disposed on the source electrode 170 and the drain electrode 180 to insulate the thin film transistor TFT The passivation layer 200 may include a via hole 208 through which a first electrode 210 is connected (e.g., electrically connected) to the thin film transistor TFT The via hole 208 may overlap the thin film transistor TFT, e.g., in plan view. The first electrode 210 may be connected (e.g., electrically connected) to the source electrode 170 of the thin film transistor TFT through the via hole 208. The passivation layer 200 may include an organic material such as acrylic resin, epoxy resin, phenolic resin, polyamide resin, and polyimide resin, or inorganic material such as silicon oxide ($SiO_x$) and silicon nitride ($SiN_x$).

The light-emitting element layer EDL may be disposed on the passivation layer 200. The light-emitting element layer EDL may include a light emitting element ED and a pixel defining layer 220. The light emitting element ED may include the first electrode 210, an organic layer EL, and a second electrode 240.

A protective layer TPL may be disposed on the passivation layer 200. The protective layer TPL and the pixel defining layer 220 may form/define an undercut portion UNC. A description thereof will be given below. The protective layer TPL may include an oxide to form an undercut portion. The protective layer TPL may be a metal oxide layer. The metal oxide layer may include, for example, one or more oxides selected from among indium (In), gallium (Ga), zinc (Zn), tin (Sn), and hafnium (Hf). In an embodiment, the protective layer TPL may include indium gallium zinc oxide (IGZO) or indium zinc oxide (IZO).

A via layer VIA may be disposed on the protective layer TPL. The via layer VIA may function to provide a flat area (or flat surface) in which the first electrode 210 is disposed. The via layer VIA may be disposed in a shape similar to the planar shape of the first light-emitting area LA1, but may be larger than the size of the first light-emitting area LA1 and smaller than the size of the protective layer TPL. The via layer VIA may overlap the first light-emitting area LA1 and may be spaced apart from each other between adjacent light emitting areas. For example, the via layer VIA may be disposed in an island shape.

The via layer VIA may include an organic insulating material, for example, organic material like acryl resin, epoxy resin, phenolic resin, polyamide resin, and polyimide resin and perform a surface planarization function.

The first electrode 210 may be disposed on the via layer VIA. The first electrode 210 may function as a pixel electrode, and may be connected (e.g., electrically connected) to the source electrode 170 of the thin film transistor TFT through the via hole 208 penetrating the via layer VIA, the protective layer TPL, and the passivation layer 200. The first electrode 210 may be an anode electrode and a reflective electrode.

The first electrode 210 may include a transparent conductive layer such as ITO, IZO, or ITZO. For example, the first electrode 210 may further include a reflective layer having high reflectance such as aluminum (Al), silver (Ag), titanium (Ti), or an APC alloy to reflect light emitted from the light emitting element ED in the third direction DR3. The APC alloy is an alloy of silver (Ag), palladium (Pd) and copper (Cu). For example, the first electrode 210 may be made of ITO/Al/ITO or ITO/APC/ITO.

The first electrode 210 may overlap the via layer VIA and may be disposed (e.g., directly disposed) on the top surface (or upper surface) of the via layer VIA. The side of the first electrode 210 may be aligned with the side of the via layer VIA. For example, the size and the shape of the first electrode 210 and the size and the shape of the via layer VIA may be the same as each other. For example, the first electrode 210 may have an island shape in plan view.

The pixel defining layer 220 may be disposed on the protective layer TPL, the via layer VIA, and the first electrode 210 to cover an edge portion of the first electrode 210 to define each pixel. The pixel defining layer 220 may include an opening OP exposing a portion of the first electrode 210 to define pixels, e.g., the light-emitting areas.

The pixel defining layer 220 may overlap an edge portion of the first electrode 210 and spaced apart from each other between adjacent light emitting areas. The pixel defining layer 220 may be patterned in an island shape. For example, the pixel defining layer 220 may include an opening OP therein, and may be formed in a closed loop shape in plan view. The pixel defining layer 220 may overlap an edge portion of the protective layer TPL in a third direction DR3.

The pixel defining layer 220 may include an organic material such as acrylic resin, epoxy resin, phenolic resin, polyamide resin, and polyimide resin or inorganic material such as silicon oxide ($SiO_x$) or silicon nitride ($SiN_x$).

An organic layer EL may be disposed on the first electrode 210, the pixel defining layer 220, and the passivation layer 200. The organic layer EL may include a light-emitting layer EML in which light is emitted, and may include functional layers above and below the light-emitting layer EML. In an embodiment, as shown in FIG. 6, the organic layer EL may include a hole injection layer HIL, a hole transport layer HTL, a light-emitting layer EML, an electron transport layer ETL, and an electron injection layer EIL. In an embodiment, the light-emitting layer EML may emit blue light. The hole injection layer HIL, the hole transport layer HTL, the light-emitting layer EML, the electron transport layer ETL, and the electron injection layer EIL may continuously extend to be disposed on the first electrode 210, the pixel defining layer 220, and the passivation layer 200. For example, the hole injection layer HIL, the hole transport layer HTL, the light-emitting layer EML, the electron transport layer ETL, and the electron injection layer EIL may be a common layer continuously disposed (or continuously extending) in adjacent light-emitting areas.

In another example, as shown in FIG. 7, the organic layer EL may include a first hole injection layer HIL1, a first hole transport layer HTL1, a first electron blocking layer BIL1, a first light-emitting layer EML1, a buffer functional layer BUF, a first electron transport layer ETL1, a charge generation layer CGL, a second hole transport layer HTL2, a second electron blocking layer BIL2, a second light-emitting layer EML2, a second electron transport layer ETL2 and an electron injection layer EIL. The charge generation layer CGL may include a p-type charge generation layer PCGL and an n-type charge generation layer NCGL. For example, the first light-emitting layer EML1 and the second light-emitting layer EML2 may each emit blue light. The organic layer EL mentioned above may be a common layer continuously disposed (or continuously extending) in adjacent light-emitting areas.

The second electrode 240 may be disposed on the organic layer EL. The second electrode 240 may be formed to cover the organic layer EL. The second electrode 240 may be a cathode electrode for injecting electrons, and may be a common layer continuously formed (or continuously extending) in each light emitting area.

The second electrode 240 may have transparency or may be transparent. In case that the second electrode 240 has transparency or is transparent, the second electrode 240 may include Ag, Mg, Cu, Al, Pt, Pd, Au, Ni, Nd, Ir, Cr, Li, Ca, LiF/Ca, LiF/Al, Mo, Ti, or a compound or a mixture thereof. e.g., a mixture of Ag and Mg. For example, in case that the thickness of the second electrode 240 ranges from several tens to several hundred angstroms, the second electrode 240 may be semi-transparent. For example, the second electrode 240 may include a transparent conductive oxide (TCO). For example, the second electrode 240 may be formed of tungsten oxide ($W_xO_y$), titanium oxide ($TiO_2$), indium tin oxide (ITO), indium zinc oxide (IZO), zinc oxide (ZnO), indium tin zinc oxide (ITZO), magnesium oxide (MgO)), etc.

As described above, the thin film transistor layer TFTL and the light-emitting element layer EDL may form the display device 10.

As described above, the organic layer EL may be a common layer continuously disposed in adjacent light-emitting areas. In case that the light emitting element ED disposed in the first light-emitting area LA1 is driven, the hole transport layer or the charge generation layer may function as a movement path for electrons and holes and the off current (or leakage current) may occur. For example, light may be emitted from the light emitting element ED in the adjacent light-emitting area, which is not to be lit, so that color mixing may occur and color coordinates may change. This may cause deterioration of display quality.

In an embodiment, by forming an undercut portion UNC under the pixel defining layer 220 and on a side of the protective layer TPL, some layers of the organic layer EL may be disconnected to prevent color mixing.

Referring to FIGS. 5 and 8 to 10, the protective layer TPL and the pixel defining layer 220 may form/define an undercut portion UNC. Sides of the pixel defining layer 220 may protrude more outward than sides of the protective layer TPL overlapping the pixel defining layer 220. For example, the sides of the protective layer TPL may be disposed inward than side edge portions of the pixel defining layer 220 to form an undercut portion UNC. For example, sides of the protective layer TPL may be disposed inward in a direction toward the first light-emitting area LA1 than sides of the pixel defining layer 220. The protective layer TPL may overlap the first light-emitting area LA1 and may have an island shape in plan view.

As shown in FIG. 8, an undercut portion (or undercut area/undercut structure) UNC, which is formed under the pixel defining layer 220 and is adjacent to a side of the protective layer TPL, may surround the first light-emitting area LA1 and the first electrode 210. For example, the undercut portion (or undercut area/undercut structure) UNC may refer to a space defined/formed by the side of the protective layer TPL, the lower surface of the pixel defining layer 220, and the upper surface of the passivation layer 200. For example, the undercut portion UNC may be an empty space. For example, the undercut portion UNC may be a space, which is filled with a material, air, or gas. The undercut portion (or undercut area/undercut structure) UNC may overlap the edge portion of the pixel defining layer 220 and may not overlap the first electrode 210. The undercut portion (or undercut area/undercut structure) UNC may have a closed loop shape in plan view.

By forming an undercut portion UNC under the pixel defining layer 220 and on the upper surface of the passivation layer 200, the hole injection layer HIL of the organic layer EL formed on the pixel defining layer 220 and the passivation layer 200 may be disconnected at a point between the pixel defining layer 220 and the passivation layer 200 and the remaining layers OFL of the organic layer EL may not be disconnected or may cover the outer side of the undercut portion UNC.

In an embodiment, the hole injection layer HIL of the organic layer EL may be disconnected by the undercut portion UNC formed under the pixel defining layer 220 and on a side of the protective layer TPL.

Referring to FIG. 9, the organic layer EL may include a hole injection layer HIL, a hole transport layer HTL, a light-emitting layer EML, an electron transport layer ETL, and an electron injection layer EIL. Due to the undercut portion UNC between the protective layer TPL and the pixel defining layer 220, the lower surface of the pixel defining layer 220 and the upper surface of the passivation layer 200 may be separated. A distance between the lower surface of the pixel defining layer 220 and the upper surface of the passivation layer 200 may be equal to a thickness T1 of the protective layer TPL.

The protective layer TPL may have the thickness T1 greater than the thickness of the hole injection layer HIL in order to disconnect the hole injection layer HIL of the organic layer EL. The thickness T1 of the protective layer TPL may be greater than the thickness of the hole injection layer HIL and smaller than the overall thickness of the organic layer EL. For example, in case that the thickness T1 of the protective layer TPL is greater than the thickness of the hole injection layer HIL, the hole injection layer HIL may be disconnected, and in case that the thickness T1 of the protective layer TPL is smaller than the overall thickness of the organic layer EL, the second electrode 240 disposed on the top portion of the organic layer EL may be prevented from being disconnected. In case that the second electrode 240 is disconnected, the second electrode 240 may not function as a common electrode, and in case that a portion of the second electrode 240 is disconnected, the resistance of the second electrode 240 may change and the display quality may deteriorate.

Since the hole injection layer HIL may function as a movement path of a hole, the off current (or leakage current) and the color mixing may be prevented or minimized by disconnecting the hole injection layer HIL. However, embodiments are not limited thereto, and at least one of the hole transport layer HTL, the light-emitting layer EML, the electron transport layer ETL, and the electron injection layer EIL may be further disconnected besides the hole injection layer HIL. In an embodiment, all of the layers constituting the organic layer EL may be disconnected due to the undercut portion UNC formed under the pixel defining layer 220 and on a side of the protective layer TPL. Since the light emitting element ED is driven with current between the first electrode 210 and the second electrode 240, light emission in the first light-emitting area LA1 may not be affected although the hole injection layer HIL, the hole transport layer HTL, the light-emitting layer EML, electron transport layer ETL and electron injection layer EIL are disconnected in areas other than the first light-emitting area LA1.

In another example, the hole injection layer HIL and the charge generation layer CGL of the organic layer EL may be disconnected by the undercut portion UNC formed under the pixel defining layer 220 and on a side of the protective layer TPL, and the remaining layers OFL of the organic layer EL may not be disconnected.

Referring to FIG. 10, the organic layer EL may include a first hole injection layer HIL1, a first hole transport layer HTL1, a first electron blocking layer BIL1, a first light-emitting layer EML1, a buffer functional layer BUF, a first electron transport layer ETL1, a charge generation layer CGL including a p-type charge generation layer PCGL and an n-type charge generation layer NCGL, a second hole transport layer HTL2, a second electron blocking layer BIL2, a second light-emitting layer EML2, a second electron transport layer ETL2, and an electron injection layer EIL.

The protective layer TPL may have a thickness T1 greater than the thickness from the hole injection layer HIL to the charge generation layer CGL in order to disconnect the first hole injection layer HIL1 and the charge generation layer CGL of the organic layer EL. For example, the thickness T1 of the protective layer TPL may be formed with a thickness greater than the sum of the thickness of the first hole transport layer HTL1, the thickness of the first electron blocking layer BIL1, the thickness of the first light-emitting layer EML1, the thickness of the buffer functional layer BUF, the thickness of the first electron transport layer ETL1, and the thickness of the charge generation layer CGL including the p-type charge generation layer PCGL and the n-type charge generation layer NCGL.

In an embodiment, the thickness T1 of the protective layer TPL may be greater than the sum of the thickness of the first hole transport layer HTL1, the thickness of the first electron blocking layer BIL1, the thickness of the first light-emitting layer EML1, the thickness of the buffer functional layer BUF, the thickness of the first electron transport layer ETL1, and the thickness of the charge generation layer CGL including the p-type charge generation layer PCGL and the n-type charge generation layer NCGL and may be smaller than the overall thickness of the organic layer EL. For example, in case that the thickness T1 of the protective layer TPL is greater than the sum of the first hole transport layer HTL1, the first electron blocking layer BIL1, the first light-emitting layer EML1, the buffer functional layer BUF, and the first electron transport layer ETL1, the first hole injection layer HIL1 and the charge generation layer CGL may be disconnected. For example, in case that the thickness T1 of the protective layer TPL is smaller than the overall thickness of the organic layer EL, the second electrode 240 disposed on the organic layer EL may be prevented from being disconnected.

As described above, since the first hole injection layer HIL1 and the charge generation layer CGL may function as a movement path for electrons and holes, the first hole injection layer HIL1 and the charge generation layer CGL may be disconnected to prevent the off current (or leakage current) and prevent color mixing from occurring. For example, the first electron blocking layer BIL1, the first light-emitting layer EML1, the buffer functional layer BUF, and the first electron transport layer ETL1 disposed between the first hole injection layer HIL1 and the charge generation layer CGL may also be disconnected due to an undercut portion UNC formed under the pixel defining layer 220 and on a side of the protective layer TPL.

However, embodiments are not limited thereto, and at least one of the second hole transport layer HTL2, the second electron blocking layer BIL2, the second light-emitting layer EML2, the second electron transport layer ETL2 and the electron injection layer EIL may be further disconnected besides the first hole injection layer HIL1 and the charge generation layer CGL. In an embodiment, all layers constituting the organic layer EL may be disconnected due to the undercut portion UNC of the pixel defining layer 220 and the protective layer TPL.

As described above, in the display device 10 according to an embodiment, the undercut portion UNC may be formed under the pixel defining layer 220 and on a side of the protective layer TPL, so that the hole injection layer HIL and/or charge generation layer CGL may be disconnected to prevent color mixing.

Hereinafter, a method of manufacturing the display device described above will be described with reference to other drawings.

FIGS. 11 to 16 are schematic diagrams illustrating a method for manufacturing a display device according to an embodiment. FIGS. 11 to 16 may correspond to the display device of FIG. 5. In an embodiment, a case in which the organic layer EL includes a hole injection layer HIL, a hole transport layer HTL, a light-emitting layer EML, an electron transport layer ETL, and an electron injection layer EIL is an example.

Figure 11:
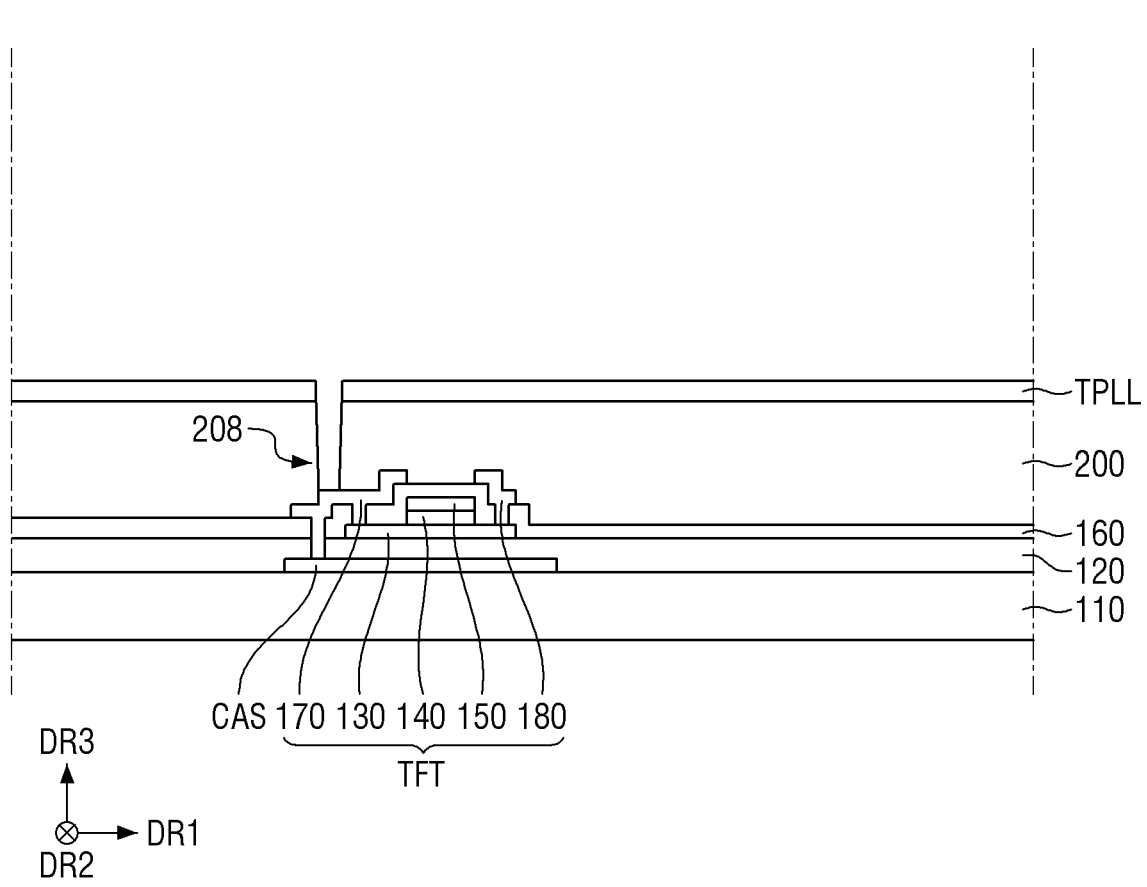
FIGS. 11 to 16 are schematic diagrams illustrating a method for manufacturing a display device according to an embodiment.

First, referring to FIG. 11, the lower metal layer CAS may be formed on the substrate 110, and the buffer layer 120 may be formed on the lower metal layer CAS. The lower metal layer CAS may be formed by a mask process. For example, a preliminary lower metal layer may be entirely deposited on the substrate 110 and then patterned through a photolithography process to form the lower metal layer CAS as shown in FIG. 11.

For example, the active layer 130 may be formed on the buffer layer 120. The active layer 130 may be formed by a mask process. For example, an oxide semiconductor or silicon may be deposited on the entire surface of the buffer layer 120 and then patterned through a photolithography process to form the active layer 130 as shown in FIG. 11.

The gate insulating layer 140 and the gate electrode 150 may be formed on the active layer 130. The gate insulating layer 140 and the gate electrode 150 may be simultaneously formed by the same etching process. For example, after depositing a gate insulating material layer and a gate electrode material layer on the entire surface of the substrate 110 including the active layer 130, the gate insulating material layer and the gate electrode material layer may be simultaneously etched by a photolithography process to form the gate insulating layer 140 and the gate electrode 150 as shown in FIG. 11.

For example, the interlayer insulating layer 160 may be formed on the gate electrode 150, and a source electrode 170 and a drain electrode 180 may be formed to manufacture the thin film transistor TFT. The source electrode 170 and the drain electrode 180 may be formed by a patterning process (e.g., photolithography process) after forming contact holes exposing the lower metal layer CAS and the active layer 130 by etching the buffer layer 120 and the interlayer insulating layer 160. The source electrode 170 may be connected (e.g., electrically connected) to the active layer 130 and the lower metal layer CAS through the contact holes, and the drain electrode 180 may be connected (e.g., electrically connected) to the active layer 130 through a contact hole.

For example, the passivation layer 200 may be formed on the substrate 110 including the thin film transistor TFT, and a protective material layer TPLL may be formed on the passivation layer 200. The passivation layer 200 may be formed by applying an organic material through a solution process such as a spin coating process, a screen printing process, or an inkjet printing process. The protective material layer TPLL may be formed of an oxide such as IGZO and may be formed as a film. The protective material layer TPLL and the passivation layer 200 may be etched by a photolithography process to form the via hole 208 exposing the source electrode 170 of the thin film transistor TFT. For example, the protective material layer TPLL may be etched by a dry etching method, and the passivation layer 200 may be etched by a wet etching method.

Figure 12:
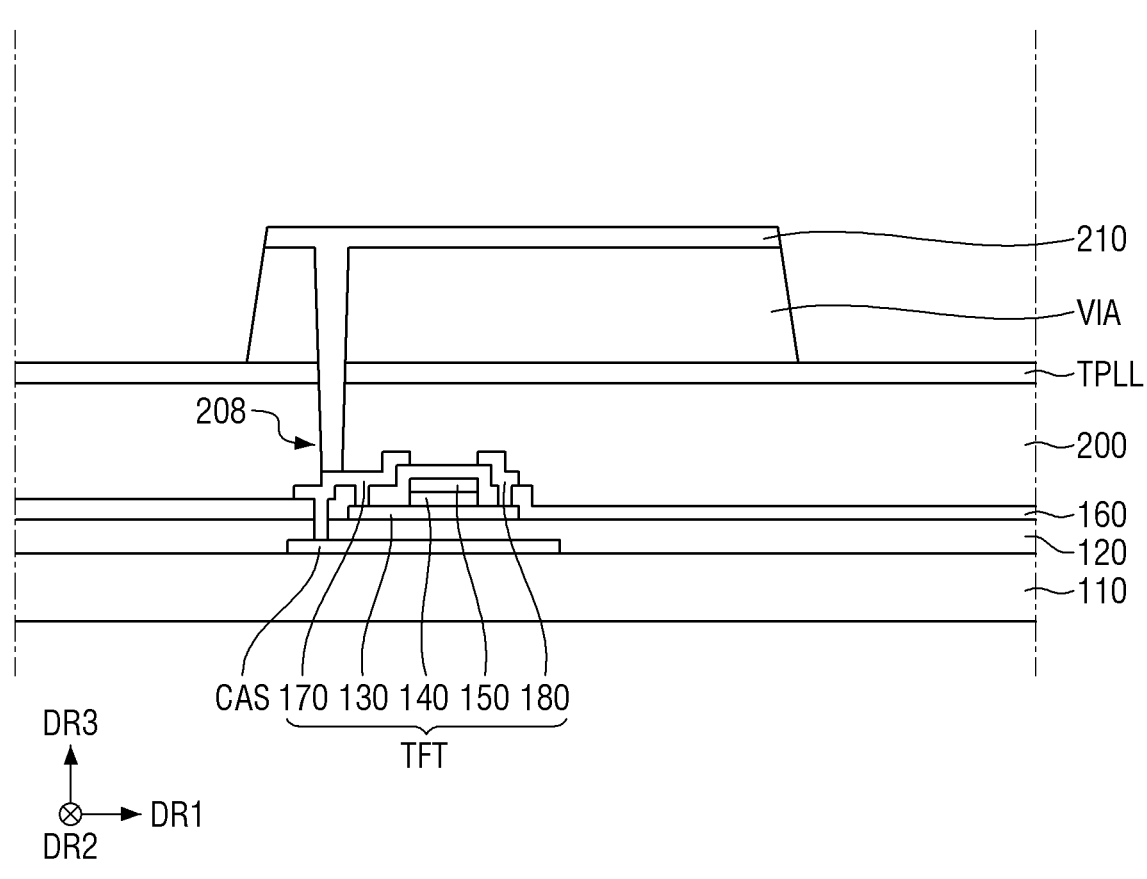

Referring to FIG. 12, the via layer VIA may be formed on the protective material layer TPLL, and the first electrode 210 may be formed on the via layer VIA.

For example, the first electrode 210 may be formed by applying a via material layer by a solution process, forming a first electrode material layer on the via material layer, and patterning the via material layer by a photolithography process. Thereafter, the via layer VIA may be formed by ashing the via material layer by using the first electrode 210 as an etch mask. For example, the first electrode 210 and the via layer VIA may be formed to have the same size and shape.

Figure 13:
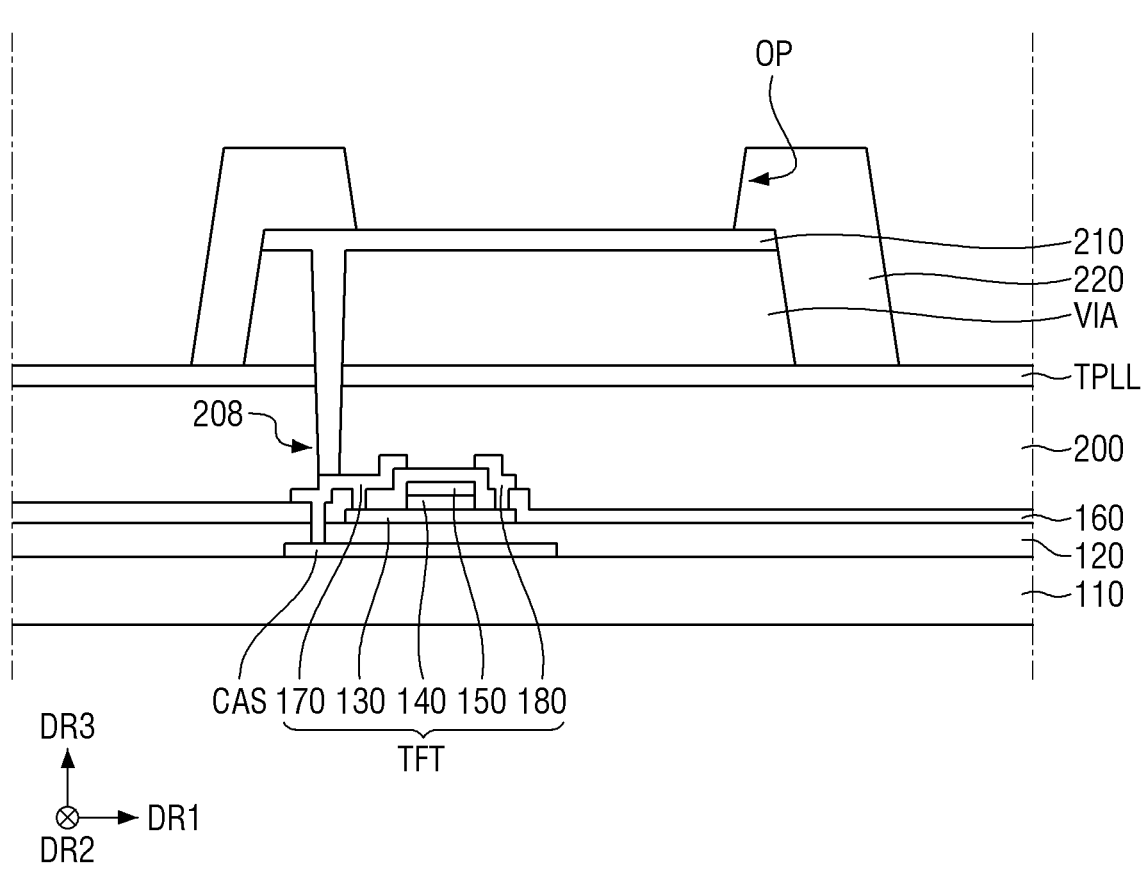

Referring to FIG. 13, the pixel defining layer 220 defining the first light-emitting area LA1 by covering the edge portion of the first electrode 210 may be formed.

The pixel defining layer 220 may be formed by applying an organic material on the substrate 110 through a solution process and then patterning by a photolithography process. The pixel defining layer 220 may be formed to include an opening OP exposing the first electrode 210 and cover an edge portion of the first electrode 210.

Figure 14:
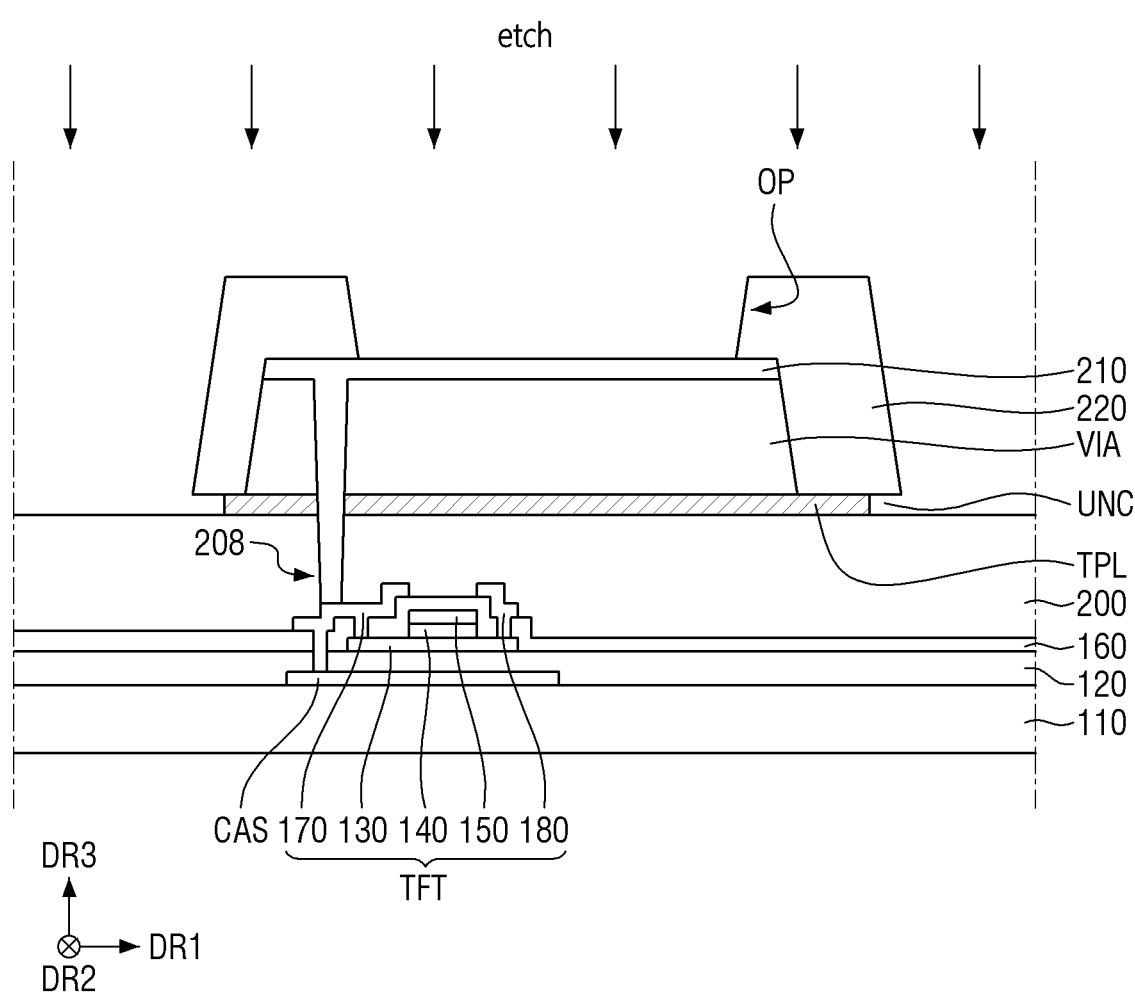

Referring to FIG. 14, the protective material layer TPLL may be etched to form the protective layer TPL.

For example, the protective material layer TPLL may be etched by a wet etching process by using the pixel defining layer 220 as an etch mask. For example, the protective material layer TPLL may be overetched by adjusting the wet etching process time and the concentration of an etchant. The protective material layer TPLL may be formed as a protective layer TPL by overetching the inner sides of the pixel defining layer 220. Thus, the protective layer TPL and the pixel defining layer 220 may form an undercut portion UNC in which sides are spaced inward from sides of the pixel defining layer 220.

Figure 15:
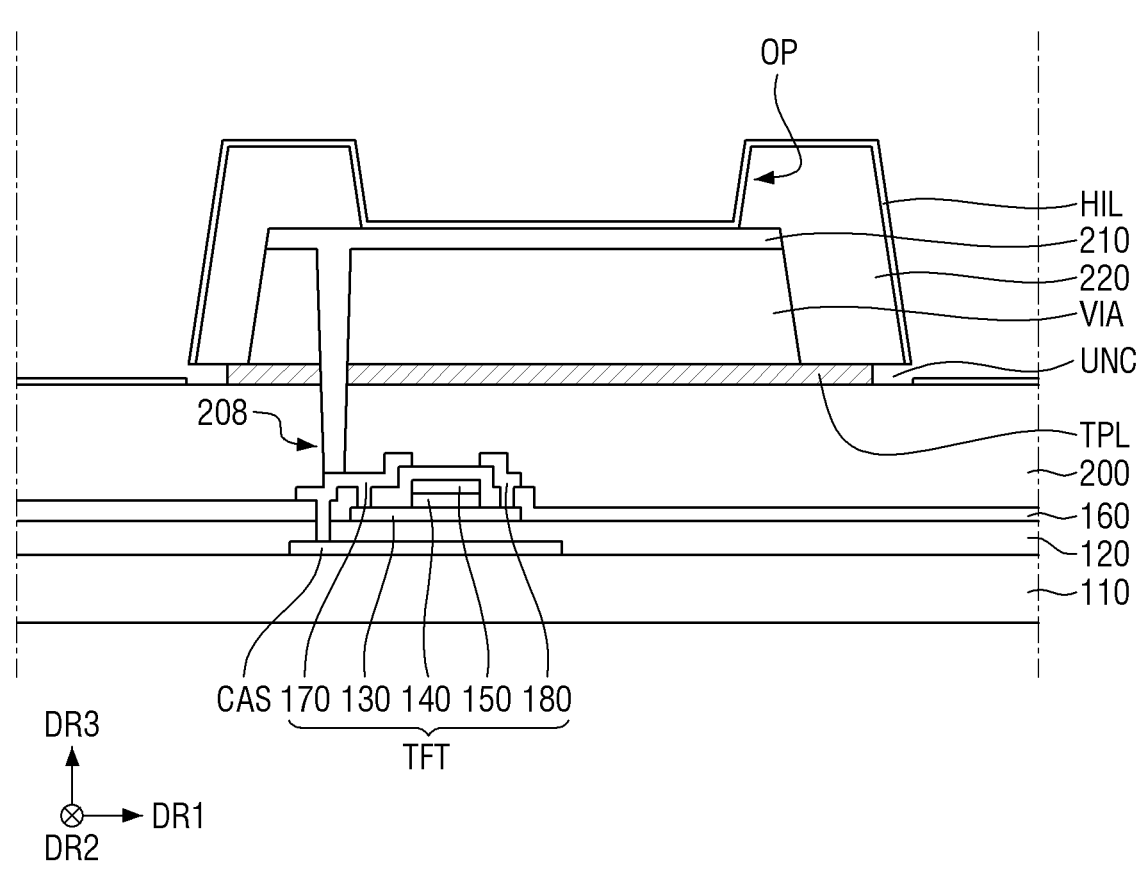

Referring to FIG. 15, the hole injection layer HIL of the organic layer EL may be formed on the substrate 110.

For example, an open mask may be aligned on the substrate 110 and a hole injection material is deposited by a vapor deposition method. The hole injection material is deposited on the first electrode 210, the pixel defining layer 220 and the passivation layer 200. For example, due to the undercut portion UNC formed under the pixel defining layer 220 and adjacent to a side of the protective layer TPL, the hole injection material may be disconnected at a point between the pixel defining layer 220 and the passivation layer 200 and continuously deposited to form the hole injection layer HIL.

Figure 16:
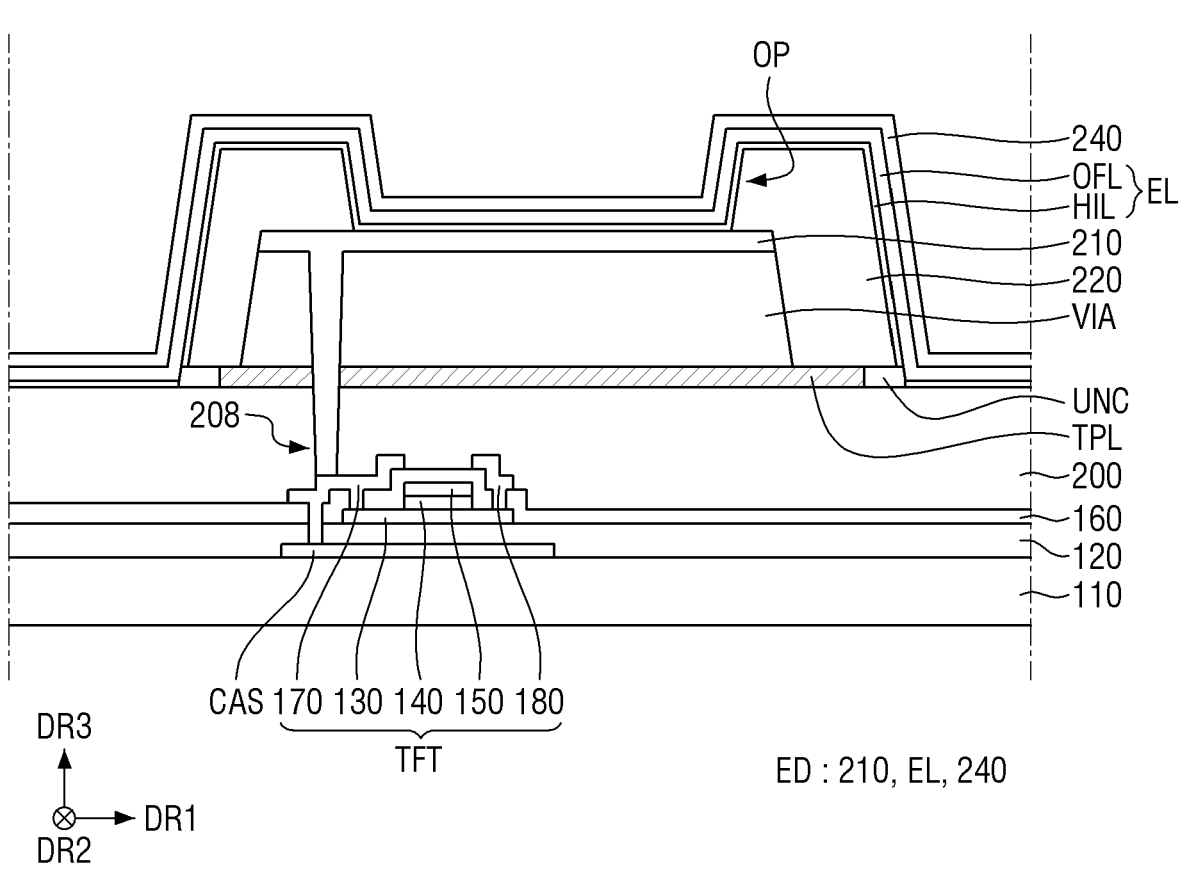

Referring to FIG. 16, the organic layer EL may be formed by stacking the remaining layers OFL of the organic layer EL, and the second electrode 240 may be formed on the organic layer EL.

The remaining layers OFL of the organic layer EL may be sequentially stacked on the hole injection layer HIL. For example, a hole transport layer HTL, a light-emitting layer EML, an electron transport layer ETL, and an electron injection layer EIL are sequentially stacked on the hole injection layer HIL. For example, the hole transport layer HTL may be continuously stacked without disconnection due to a small gap between the hole injection layer HIL stacked on the passivation layer 200 and the pixel defining layer 220. Thereafter, the light-emitting layer EML, the electron transport layer ETL, and the electron injection layer EIL may be successively stacked along the hole transport layer HTL.

The display device 10 may be manufactured by forming the second electrode 240 entirely on the organic layer EL.

Hereinafter, a display device according to an embodiment will be described with reference to other drawings.

Figure 17:
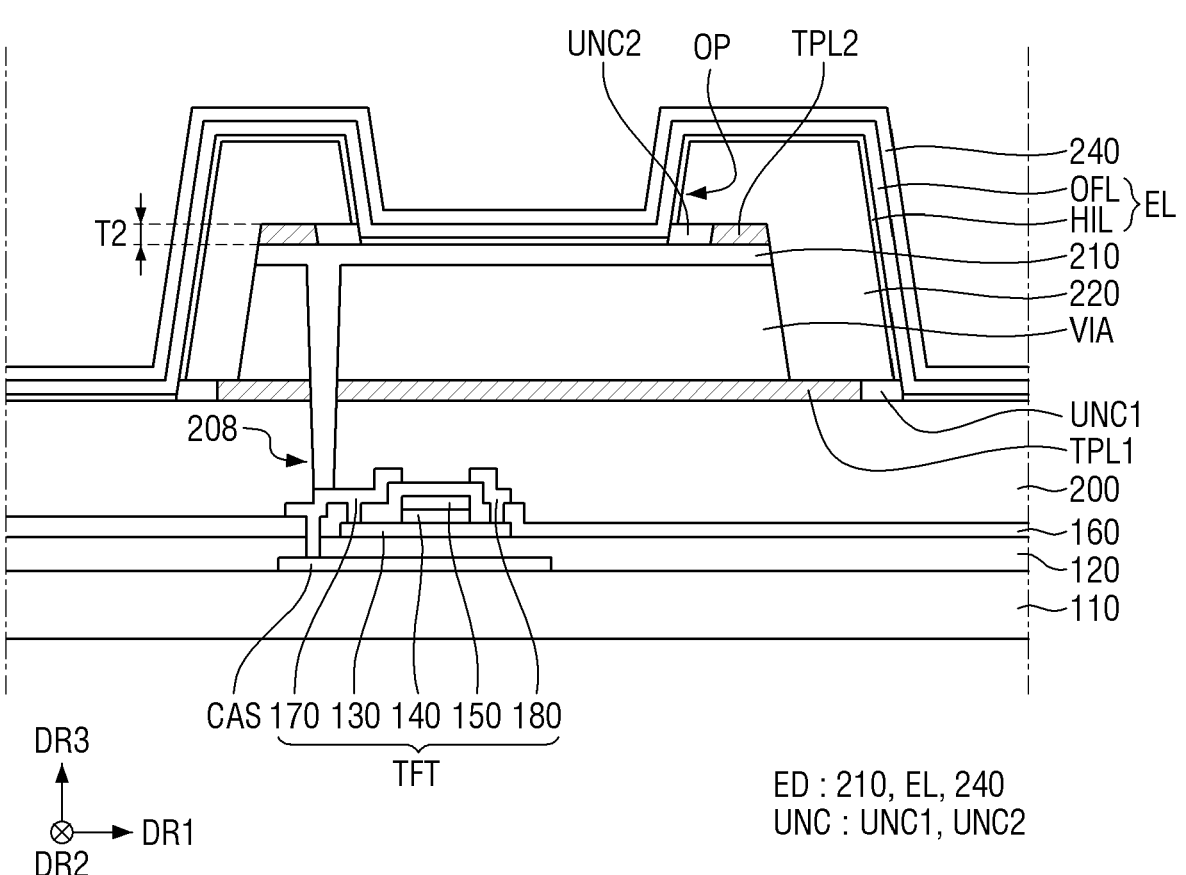
FIG. 17 is a schematic cross-sectional view of a display device according to an embodiment.
Figure 18:
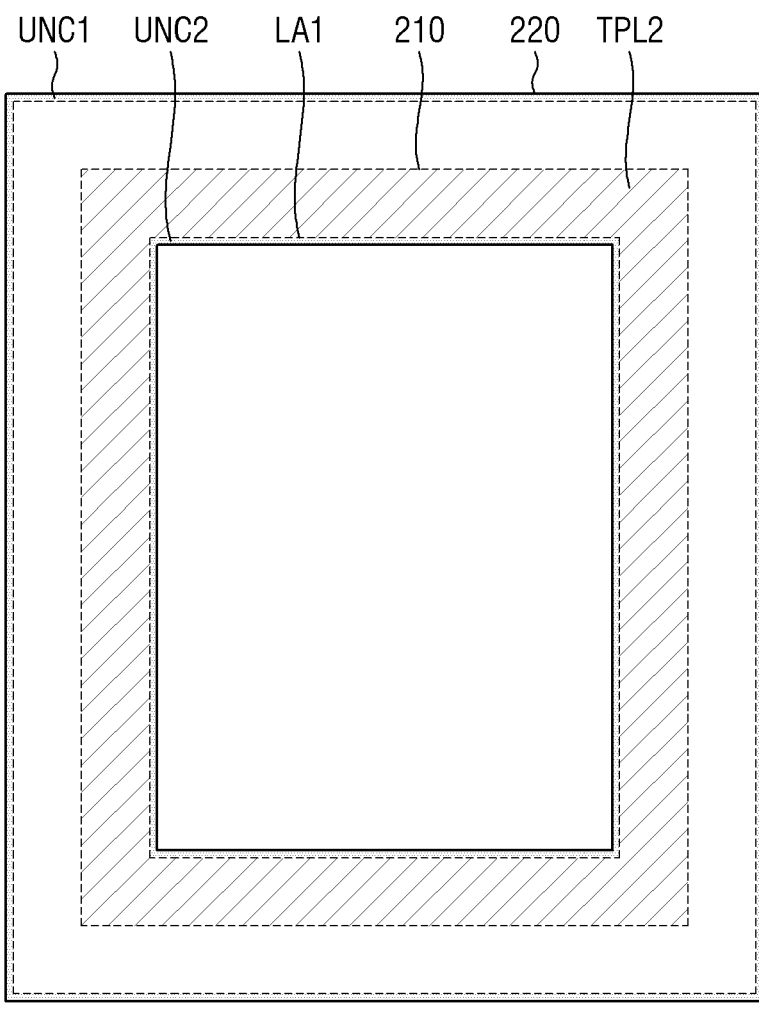
FIG. 18 is a schematic plan view showing a first light-emitting area of a display device according to an embodiment.

FIG. 17 is a schematic cross-sectional view of a display device according to an embodiment. FIG. 18 is a schematic plan view showing a first light-emitting area of a display device according to an embodiment.

The embodiment of FIGS. 17 and 18 is different from that of FIGS. 5 to 10 in that a second protective layer TPL2 is further disposed on the first electrode 210, and an undercut portion UNC is further disposed on a side of the second protective layer TPL2 and between the pixel defining layer 220 and the anode electrode 210. In the following description, the description will focus on the difference and the redundant description will be omitted for descriptive convenience.

The first protective layer TPL1 may be disposed on the passivation layer 200. The first protective layer TPL1 may form an undercut portion UNC with respect to the pixel defining layer 220. Since the first protective layer TPL1 is the same as the protective layer TPL of the embodiments of FIGS. 5 to 10 described above, a description thereof will be omitted for descriptive convenience.

The second protective layer TPL2 may be disposed on the first electrode 210. The second protective layer TPL2 may be disposed (e.g., directly disposed) on the upper surface of the first electrode 210 to overlap the first electrode 210 and may be disposed at an edge portion of the first electrode 210. The first protective layer TPL1 described above may be a first metal oxide layer, and the second protective layer TPL2 may be a second metal oxide layer. The second protective layer TPL2 may form an undercut portion UNC with the pixel defining layer 220. An inner side of the pixel defining layer 220 may protrude more outward than an inner side of the second protective layer TPL2. For example, the inner side may refer to a side adjacent to the first light-emitting area LA1, and the outer side may refer to a side facing the inner side.

As shown in FIG. 18, the second protective layer TPL2 may surround the first light-emitting area LA1. The second protective layer TPL2 may have a closed loop shape in plan view. The second protective layer TPL2 may overlap the pixel defining layer 220, the first electrode 210, the via layer VIA, and the first protective layer TPL1. A second undercut portion (or second undercut area/second undercut structure) UNC2 formed on a side of the second protective layer TPL2 and between the pixel defining layer 220 and the anode electrode 210 may surround the first light-emitting area LA1. The second undercut portion UNC2 may overlap the inner edge portion of the pixel defining layer 220 and may overlap the first electrode 210. The second undercut portion UNC2 may have a closed loop shape in plan view. For example, since a first undercut portion (or first undercut area/first undercut structure) UNC1 corresponds to the undercut portion UNC of the embodiments of FIGS. 5 to 10 described above, a description thereof is omitted for descriptive convenience.

In an embodiment, by forming the first undercut portion UNC1 under the pixel defining layer 220 and on a side of the first protective layer TPL1, and by forming the second undercut portion UNC2 on a side of the second protective layer TPL2 and between the pixel defining layer 220 and the anode electrode 210, the hole injection layer HIL of the organic layer EL may be disconnected at a point between the pixel defining layer 220 and the passivation layer 200 and between the pixel defining layer 220 and the first electrode 210 and the remaining layers OFL of the organic layer EL may not be disconnected.

A thickness T2 of the second protective layer TPL2 may be substantially equal to the distance between the lower surface of the pixel defining layer 220 and the upper surface of the first electrode 210. The thickness T2 of the second protective layer TPL2 may be greater than the thickness of the hole injection layer HIL and smaller than the overall thickness of the organic layer EL.

As described above, the hole injection layer HIL may function as a path for moving holes, and the charge generation layer may also function as a path for moving charges. In an embodiment, by forming the first protective layer TPL1 and the second protective layer TPL2 to form two undercut portions, the hole injection layer HIL and/or the charge generation layer are disconnected to prevent the off current (or leakage current) and to prevent color mixing.

Hereinafter, a method of manufacturing the display device described above will be described with reference to other drawings.

FIGS. 19 to 23 are diagrams illustrating a method for manufacturing a display device according to an embodiment. FIGS. 19 to 23 may correspond to the display device of FIG. 17. In an embodiment, a case in which the organic layer EL includes a hole injection layer HIL, a hole transport layer HTL, a light-emitting layer EML, an electron transport layer ETL, and an electron injection layer EIL is an example. For example, the manufacturing method covering up to the passivation layer 200, which is similar to/same as those of the embodiments of FIGS. 11 to 16 described above, will be omitted for descriptive convenience.

Figure 19:
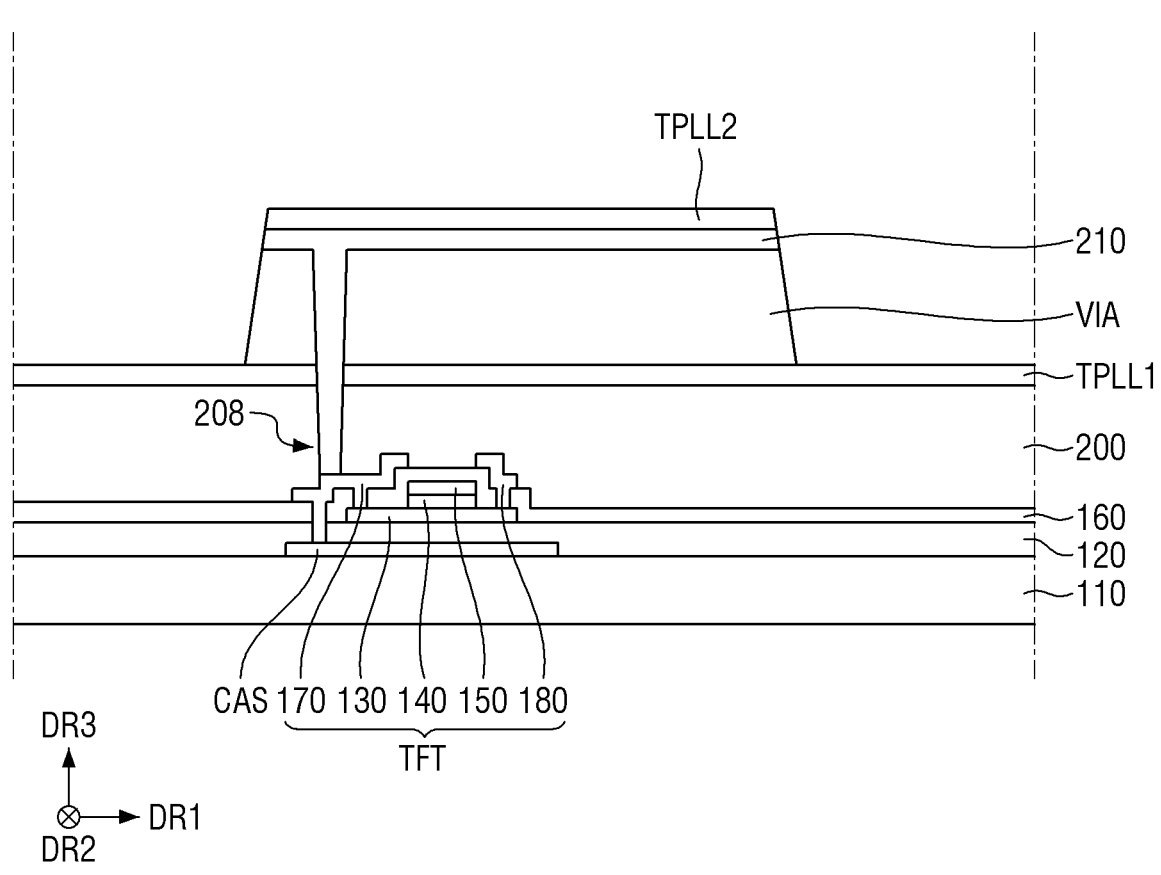
FIGS. 19 to 23 are schematic diagrams illustrating a method for manufacturing a display device according to an embodiment.

Referring to FIG. 19, the first protective material layer TPLL1 may be formed on the passivation layer 200, and the via layer VIA and the first electrode 210 may be formed on the first protective material layer TPLL1. The first protective material layer TPLL1 may be formed of an oxide such as IGZO and may be formed as a film.

For example, a via material layer may be formed on the first protective material layer TPLL1, and the first electrode 210 and the second protective material layer TPLL2 may be formed on the via material layer. The first electrode 210 and the second protective material layer TPLL2 may be formed by forming a first electrode material layer and a second protective material layer on the via material layer and patterning through a photolithography process to form the first electrode 210 and the second protective material layer TPLL2. The first electrode 210 and the second protective material layer TPLL2 may be simultaneously etched by a wet etching process and formed to have the same size and shape.

Thereafter, the via layer VIA may be formed by ashing the via material layer by using the second protective material layer TPLL2 as an etch mask. For example, the first electrode 210, the second protective material layer TPLL2, and the via layer VIA may be formed to have the same size and shape.

Figure 20:
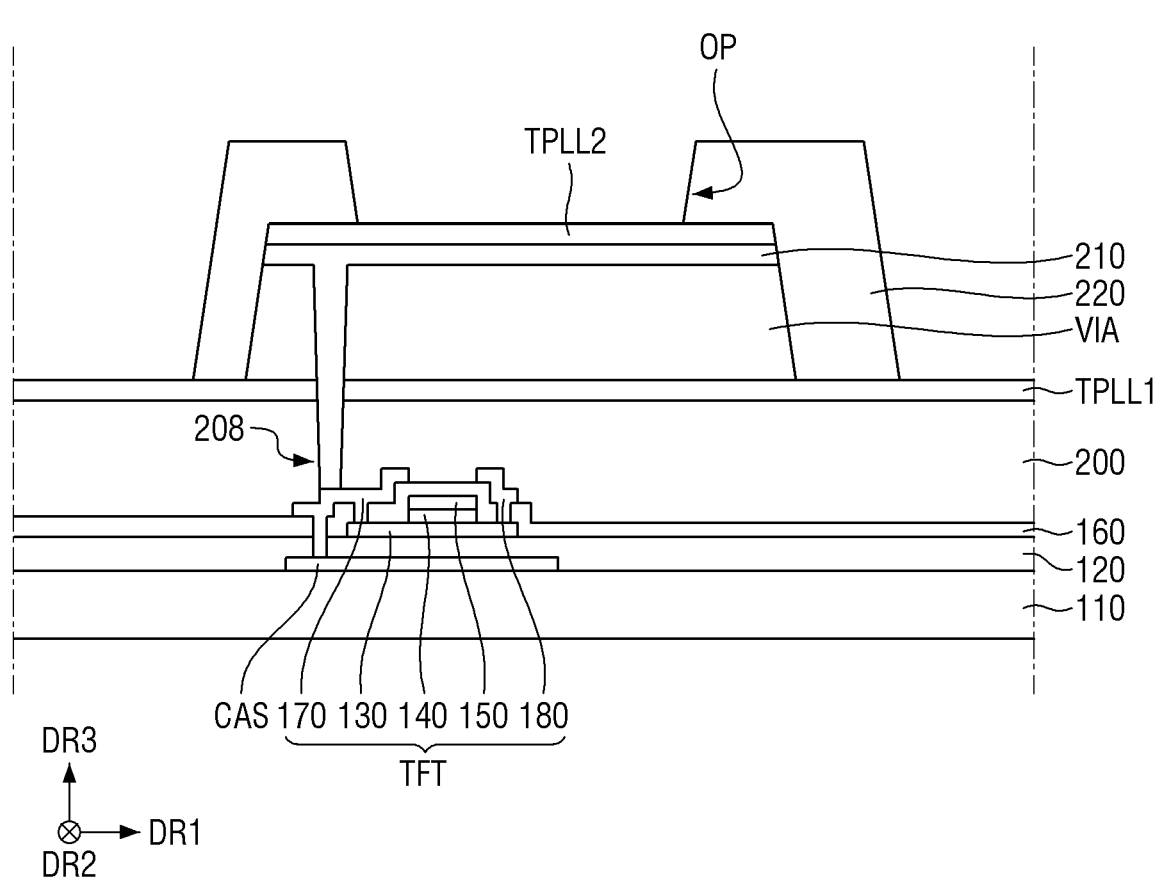

Referring to FIG. 20, the pixel defining layer 220 may be formed to define the first light-emitting area LA1 by covering the edge portion of the second protective material layer TPLL2.

The pixel defining layer 220 may be formed by applying an organic material on the substrate 110 by a solution process and by patterning the organic material by a photolithography process. The pixel defining layer 220 may be formed to include an opening OP exposing the second protective material layer TPLL2 and may cover an edge portion of the second protective material layer TPLL2.

Figure 21:
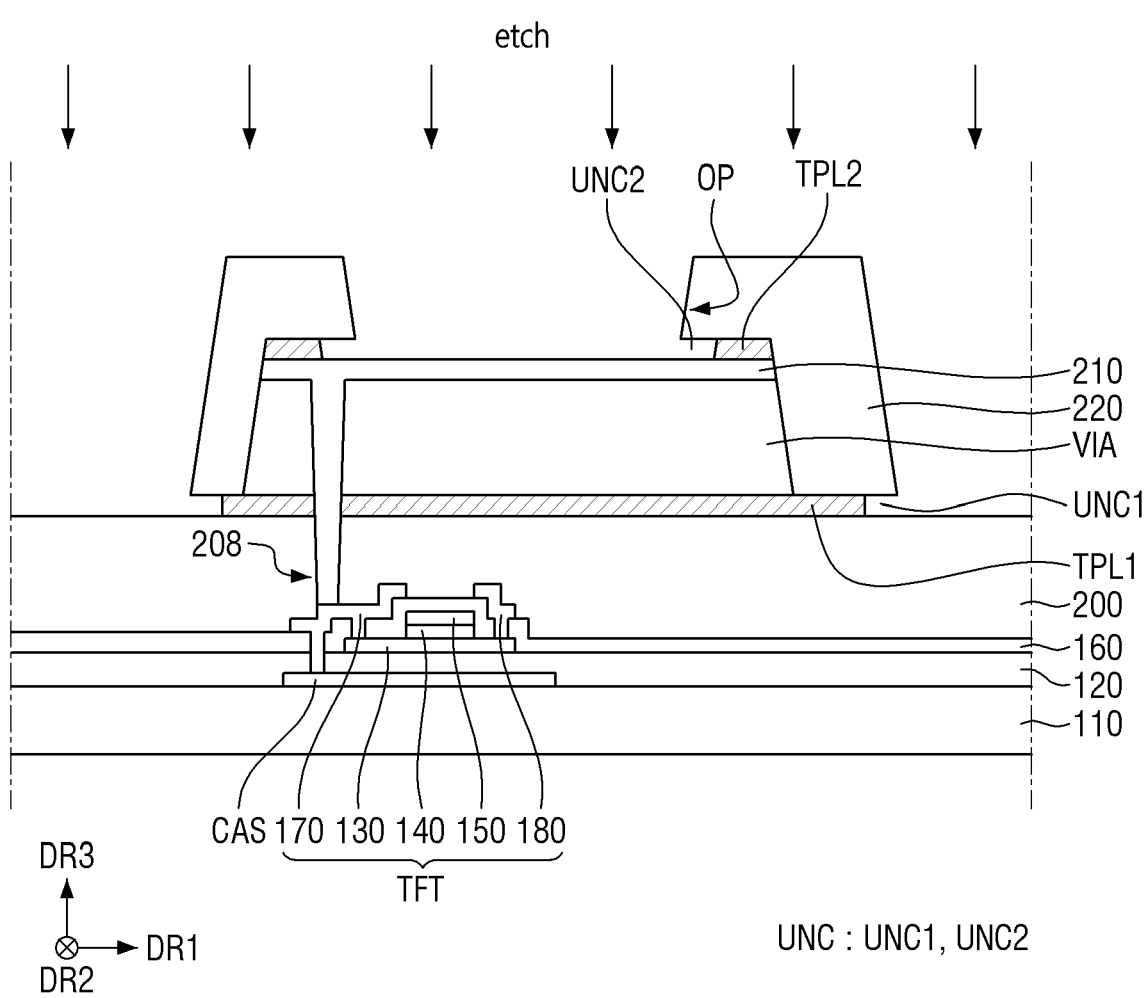

Referring to FIG. 21, the first protective material layer TPLL1 and the second protective material layer TPLL2 may be etched to form the first protective layer TPL1 and the second protective layer TPL2.

For example, the first protective material layer TPLL1 and the second protective material layer TPLL2 may be etched by a wet etching process by using the pixel defining layer 220 as an etch mask. For example, the first protective material layer TPLL1 and the second protective material layer TPLL2 may be overetched by adjusting the wet etching process time and the concentration of the etchant. The first protective material layer TPLL1 may be overetched inward from the outer side of the pixel defining layer 220 to form the first protective layer TPL1. The second protective material layer TPLL2 may be overetched inward from the inner side of the pixel defining layer 220 to form the second protective layer TPL2. Finally, the first protective layer TPL1 may be formed in an undercut portion UNC in which the sides are spaced apart from the outer sides of the pixel defining layer 220, and the second protective layer TPL2 may be formed in an undercut portion UNC in which the side is spaced apart from the inner side of the pixel defining layer 220. For example, the first electrode 210 may be exposed to the first light-emitting area LA1 by etching the second protective material layer TPLL2.

The undercut portions UNC described above may be simultaneously formed in the same process. In case that the first protective layer TPL1 and the second protective layer TPL2 are made of the same material, the distance at which the sides of the first protective layer TPL1 are spaced inward from the outer sides of the pixel defining layer 220 and the distance at which the side of the second protective layer TPL2 is spaced inward from the inner side of the pixel defining layer 220 may be formed to be the same. In an embodiment, in case that the first protective layer TPL1 and the second protective layer TPL2 are made of different materials, the distance at which the sides of the first protective layer TPL1 are spaced inward from the outer sides of the pixel defining layer 220 and the distance at which the side of the second protective layer TPL2 is spaced inward from the inner side of the pixel defining layer 220 may be formed to be different.

Figure 22:
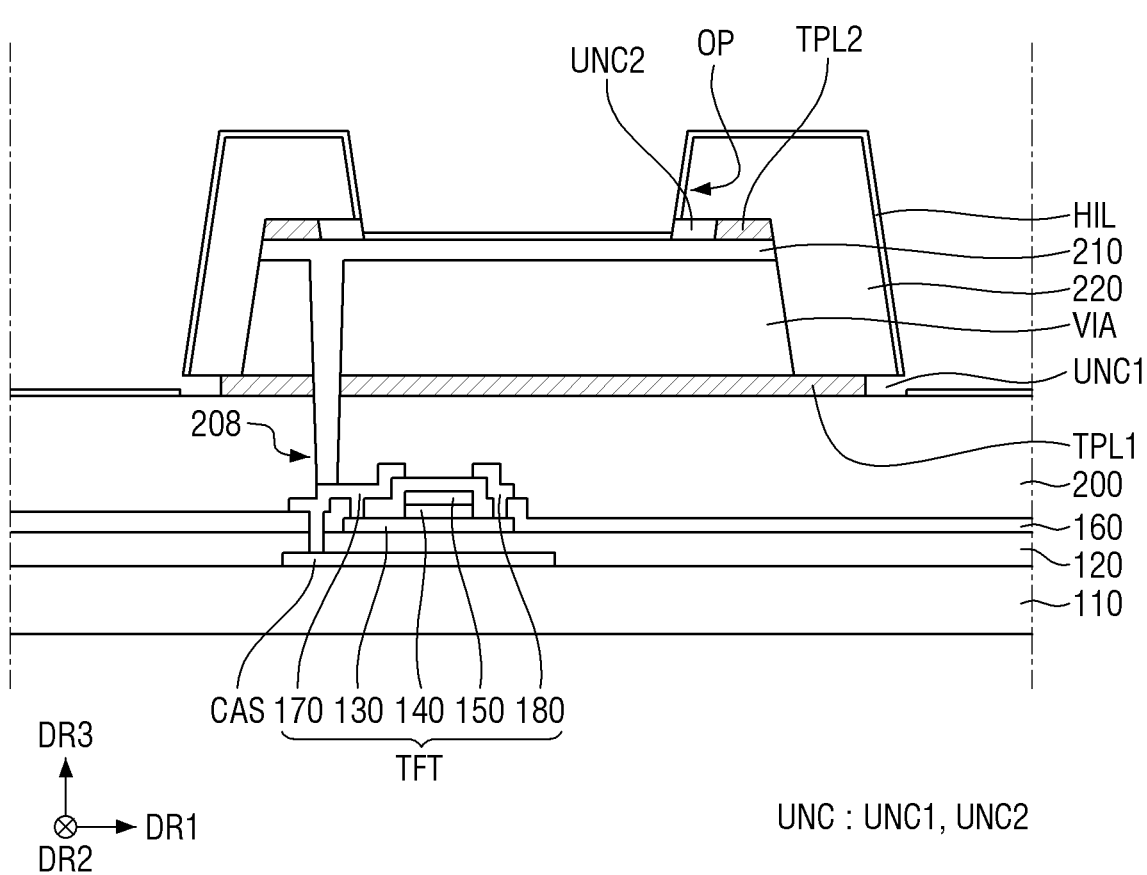

Referring to FIG. 22, the hole injection layer HIL of the organic layer EL may be formed on the substrate 110.

For example, an open mask may be aligned on the substrate 110 and a hole injection material is deposited by a vapor deposition method. The hole injection material may be deposited on the first electrode 210, the pixel defining layer 220 and the passivation layer 200. For example, due to the first undercut portion UNC1 formed below the pixel defining layer 220 and on a side of the first protective layer TPL1 and the second undercut portion UNC2 formed below the pixel defining layer 220 and on a side of the second protective layer TPL2, the hole injection material may be disconnected at a point between the pixel defining layer 220 and the passivation layer 200 and at a point between the pixel defining layer 220 and the first electrode 210 and continuously deposited to form the hole injection layer HIL.

Figure 23:
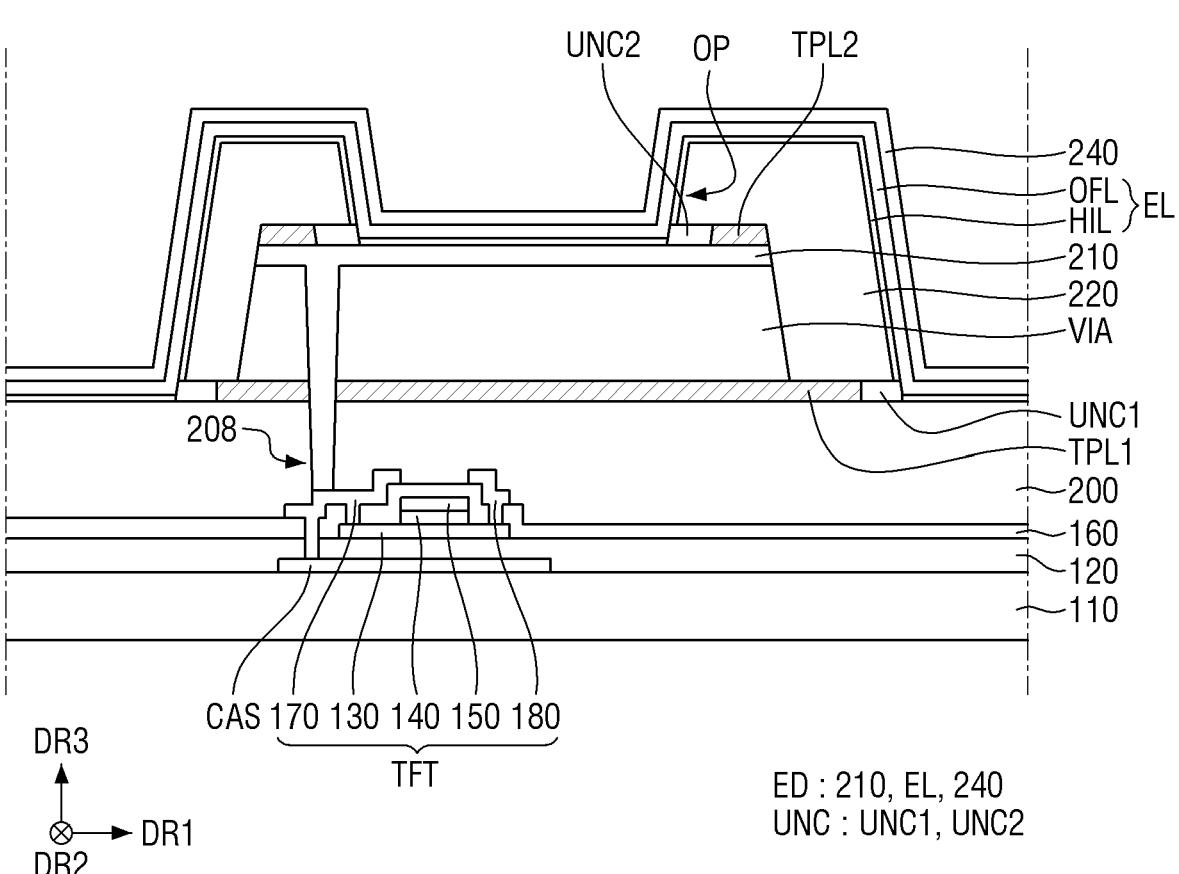

Referring to FIG. 23, the organic layer EL may be formed by stacking the remaining layers OFL of the organic layer EL, and the second electrode 240 may be formed on the organic layer EL.

The remaining layers OFL of the organic layer EL may be sequentially stacked on the hole injection layer HIL. For example, the hole transport layer HTL, the light-emitting layer EML, the electron transport layer ETL, and an electron injection layer EIL may be sequentially stacked on the hole injection layer HIL. The display device 10 may be manufactured by forming the second electrode 240 entirely on the organic layer EL.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device, comprising:
   a substrate;
   a passivation layer disposed on the substrate;
   a metal oxide layer disposed on the passivation layer;
   a via layer disposed on the metal oxide layer;
   a first electrode disposed on the via layer;
   a pixel defining layer covering the metal oxide layer and an edge portion of the first electrode, the pixel defining layer dividing a light-emitting area;
   an organic layer disposed on the first electrode and the pixel defining layer; and
   a second electrode disposed on the organic layer, wherein
   a side of the pixel defining layer protrudes more outward than a side of the metal oxide layer, and
   at least a portion of the organic layer is disconnected at a point between the side of the pixel defining layer and the passivation layer.

2. The display device of claim 1, wherein the metal oxide layer and the pixel defining layer form an undercut portion.

3. The display device of claim 2, wherein the undercut portion surrounds the light-emitting area.

4. The display device of claim 1, wherein
   a thickness of the metal oxide layer and a distance between a lower surface of the pixel defining layer and an upper surface of the passivation layer is same as each other, and
   the thickness of the metal oxide layer is smaller than a thickness of the organic layer.

5. The display device of claim 1, wherein the organic layer comprises a hole injection layer, a hole transport layer, a light-emitting layer, an electron transport layer, and an electron injection layer.

6. The display device of claim 5, wherein the hole injection layer is disconnected by an undercut portion disposed between the side of the pixel defining layer and the passivation layer.

7. The display device of claim 5, wherein a thickness of the metal oxide layer is greater than a thickness of the hole injection layer.

8. The display device of claim 1, wherein
the metal oxide layer overlaps the via layer, the first electrode, and the pixel defining layer, and
the metal oxide layer has an island shape.

9. The display device of claim 1, wherein
a size of the via layer is smaller than a size of the metal oxide layer, and
the via layer and the first electrode have an island shape in plan view.

10. The display device of claim 1, wherein
the organic layer comprises at least a hole injection layer and a charge generating layer, and
the hole injection layer and the charge generating layer, or only the hole injection layer is disconnected by an undercut portion disposed between the side of the pixel defining layer and the passivation layer.

11. A display device, comprising:
a substrate;
a passivation layer disposed on the substrate;
a first metal oxide layer disposed on the passivation layer;
a via layer disposed on the first metal oxide layer;
a first electrode disposed on the via layer;
a second metal oxide layer disposed on an edge portion of the first electrode;
a pixel defining layer covering the second metal oxide layer and dividing a light-emitting area;

an organic layer disposed on the first electrode and the pixel defining layer; and
a second electrode disposed on the organic layer, wherein
an outer side of the pixel defining layer protrudes more outward than a side of the first metal oxide layer,
an inner side of the pixel defining layer protrudes more outward than a side of the second metal oxide layer, and
at least a portion of the organic layer is disconnected at a point between the outer side of the pixel defining layer and the passivation layer and at a point between the inner side of the pixel defining layer and the first electrode.

12. The display device of claim 11, wherein
the organic layer comprises a hole injection layer, a hole transport layer, a light-emitting layer, an electron transport layer, and an electron injection layer, and
the hole injection layer is disconnected by a first undercut portion disposed between the outer side of the pixel defining layer and the passivation layer and by a second undercut portion disposed between the inner side of the pixel defining layer and the first electrode.

13. The display device of claim 11, wherein
the organic layer comprises at least a hole injection layer and a charge generating layer, and
the hole injection layer and the charge generating layer, or only the hole injection layer is disconnected by a first undercut portion disposed between the outer side of the pixel defining layer and the passivation layer and by a second undercut portion disposed between the inner side of the pixel defining layer and the first electrode.

14. The display device of claim 11, wherein
a side of the first electrode and the outer side of the second metal oxide layer are aligned and coincide with each other, and
the side of the first electrode and a side of the via layer are aligned and coincide with each other.

* * * * *